United States Patent
Meneau et al.

(10) Patent No.: US 12,474,186 B2
(45) Date of Patent: Nov. 18, 2025

(54) FOOTWEAR-BASED BODY PRESENCE DETECTOR

(71) Applicant: Nike Inc., Beaverton, OR (US)

(72) Inventors: Phillip Meneau, Portland, OR (US); Erin McAuliffe, Beaverton, OR (US)

(73) Assignee: NIKE, Inc., Beaverton, OR (US)

( * ) Notice: Subject to any disclaimer, the term of this patent is extended or adjusted under 35 U.S.C. 154(b) by 216 days.

(21) Appl. No.: 18/217,928

(22) Filed: Jul. 3, 2023

(65) Prior Publication Data

US 2024/0019277 A1 Jan. 18, 2024

Related U.S. Application Data

(60) Provisional application No. 63/388,900, filed on Jul. 13, 2022.

(51) Int. Cl.
*G01D 5/24* (2006.01)
*A43B 3/34* (2022.01)
(Continued)

(52) U.S. Cl.
CPC ............ *G01D 5/24* (2013.01); *A43B 3/34* (2022.01); *G01R 27/2605* (2013.01); *H03K 17/962* (2013.01); *H03K 2217/960755* (2013.01)

(58) Field of Classification Search
CPC ........ G01R 27/00; G01R 27/02; G01R 27/26; G01R 27/2605; G01D 5/00; G01D 5/12; G01D 5/14; G01D 5/24; A43B 3/00; A43B 3/34; A43B 3/44; A43C 11/00; H03K 17/00; H03K 17/94; H03K 17/96; H03K 17/962; H03K 17/9625; H03K 2217/00; H03K 2217/94; H03K 2217/96; H03K 2217/96015; H03K 2217/96042; H03K 2217/9607; H03K 2217/960755
(Continued)

(56) References Cited

U.S. PATENT DOCUMENTS 5,929,332 A 7/1999 Brown
10,172,423 B2 * 1/2019 Walker .................. G05B 15/02
(Continued)

FOREIGN PATENT DOCUMENTS

CN 119403468 A 2/2025
CN 119403469 A 2/2025
(Continued)

OTHER PUBLICATIONS

"International Application Serial No. PCT US2023 026833, International Search Report mailed Oct. 20, 2023", 7 pgs.
(Continued)

*Primary Examiner* — Hoai-An D. Nguyen
(74) *Attorney, Agent, or Firm* — Quinn IP Law

(57) ABSTRACT

Active footwear can include a system to automatically detect a presence or absence of a foot. In an example, the system can be configured to provide information about a liquid saturation level that can affect a sensitivity or performance of the foot presence sensor. The system can use time-multiplexed signals to excite respective different electrodes in a foot presence sensor, and the electrodes can generate respective electric fields inside the footwear. Interruptions in the fields can be detected and used to determine foot presence or absence or a liquid saturation level.

18 Claims, 17 Drawing Sheets

(51) Int. Cl.
*G01R 27/26* (2006.01)
*H03K 17/96* (2006.01)

(58) Field of Classification Search
USPC ............................ 324/600, 649, 658, 686
See application file for complete search history.

(56) References Cited

U.S. PATENT DOCUMENTS

| | | | |
|---|---|---|---|
| 10,448,707 B2 * | 10/2019 | Walker | A43B 17/00 |
| 11,064,768 B2 * | 7/2021 | Walker | G01D 5/24 |
| 11,071,355 B2 * | 7/2021 | Walker | A43B 3/36 |
| 2007/0006489 A1 | 1/2007 | Case et al. | |
| 2010/0154255 A1 | 6/2010 | Robinson et al. | |
| 2013/0181936 A1 | 7/2013 | Tabone et al. | |
| 2016/0363462 A1 | 12/2016 | English et al. | |
| 2017/0265582 A1 | 9/2017 | Walker et al. | |
| 2018/0360157 A1 | 12/2018 | Jeong et al. | |
| 2019/0166954 A1 | 6/2019 | Walker et al. | |
| 2022/0062743 A1 | 3/2022 | Zhang | |
| 2024/0016255 A1 | 1/2024 | Meneau et al. | |

FOREIGN PATENT DOCUMENTS

| | | | |
|---|---|---|---|
| KR | 20250036740 A | 3/2025 | |
| KR | 20250036884 A | 3/2025 | |
| TW | 202139878 A * | 11/2021 | A43B 1/0054 |
| WO | 2022136345 | 6/2022 | |
| WO | WO-2024015234 A1 | 1/2024 | |
| WO | WO-2024015235 A1 | 1/2024 | |

OTHER PUBLICATIONS

"International Application Serial No. PCT US2023 026833, Written Opinion mailed Oct. 20, 2023", 5 pgs.

"International Application Serial No. PCT US2023 06843, International Search Report mailed Oct. 20, 2023", 6 gs.

"International Application Serial No. PCT US2023 06843, Written Opinion mailed Oct. 20, 2023", 4 pgs.

"European Application Serial No. 23840139.2, Response to Communication pursuant to Rules 161(2) and 162 EPC filed Jul. 1, 2025", 18 pgs.

"European Application Serial No. 23840140.0, Response to Communication pursuant to Rules 161(2) and 162 EPC filed Jul. 1, 2025", 17 pgs.

"International Application Serial No. PCT/US2023/026833, International Preliminary Report on Patentability mailed Jan. 23, 2025", 7 pgs.

* cited by examiner

FOOTWEAR-BASED BODY PRESENCE DETECTOR

PRIORITY APPLICATIONS

This application claims the benefit of priority to U.S. Provisional Application Ser. No. 63/388,900, filed Jul. 13, 2022, the content of which is incorporated herein by reference in its entirety.

BACKGROUND

Various shoe-based sensors have been proposed to monitor various conditions. For example, Brown, in U.S. Pat. No. 5,929,332, titled "Sensor shoe for monitoring the condition of a foot", provides several examples of shoe-based sensors. Brown mentions a foot force sensor can include an insole made of layers of relatively thin, planar, flexible, resilient, dielectric material. The foot force sensor can include electrically conductive interconnecting means that can have an electrical resistance that changes based on an applied compressive force.

Brown further discusses a shoe to be worn by diabetic persons, or persons afflicted with various types of foot maladies, where excess pressure exerted upon a portion of the foot tends to give rise to ulceration. The shoe body can include a force sensing resistor (FSR), and a switching circuit coupled to the resistor can activate an alarm unit to warn a wearer that a threshold pressure level is reached or exceeded.

Devices for automatically tightening an article of footwear have been previously proposed. Liu, in U.S. Pat. No. 6,691,433, titled "Automatic tightening shoe", provides a first fastener mounted on a shoe's upper portion, and a second fastener connected to a closure member and capable of removable engagement with the first fastener to retain the closure member at a tightened state. Liu teaches a drive unit mounted in the heel portion of the sole. The drive unit includes a housing, a spool rotatably mounted in the housing, a pair of pull strings and a motor unit. Each string has a first end connected to the spool and a second end corresponding to a string hole in the second fastener. The motor unit is coupled to the spool. Liu teaches that the motor unit is operable to drive rotation of the spool in the housing to wind the pull strings on the spool for pulling the second fastener towards the first fastener. Liu also teaches a guide tube unit that the pull strings can extend through.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
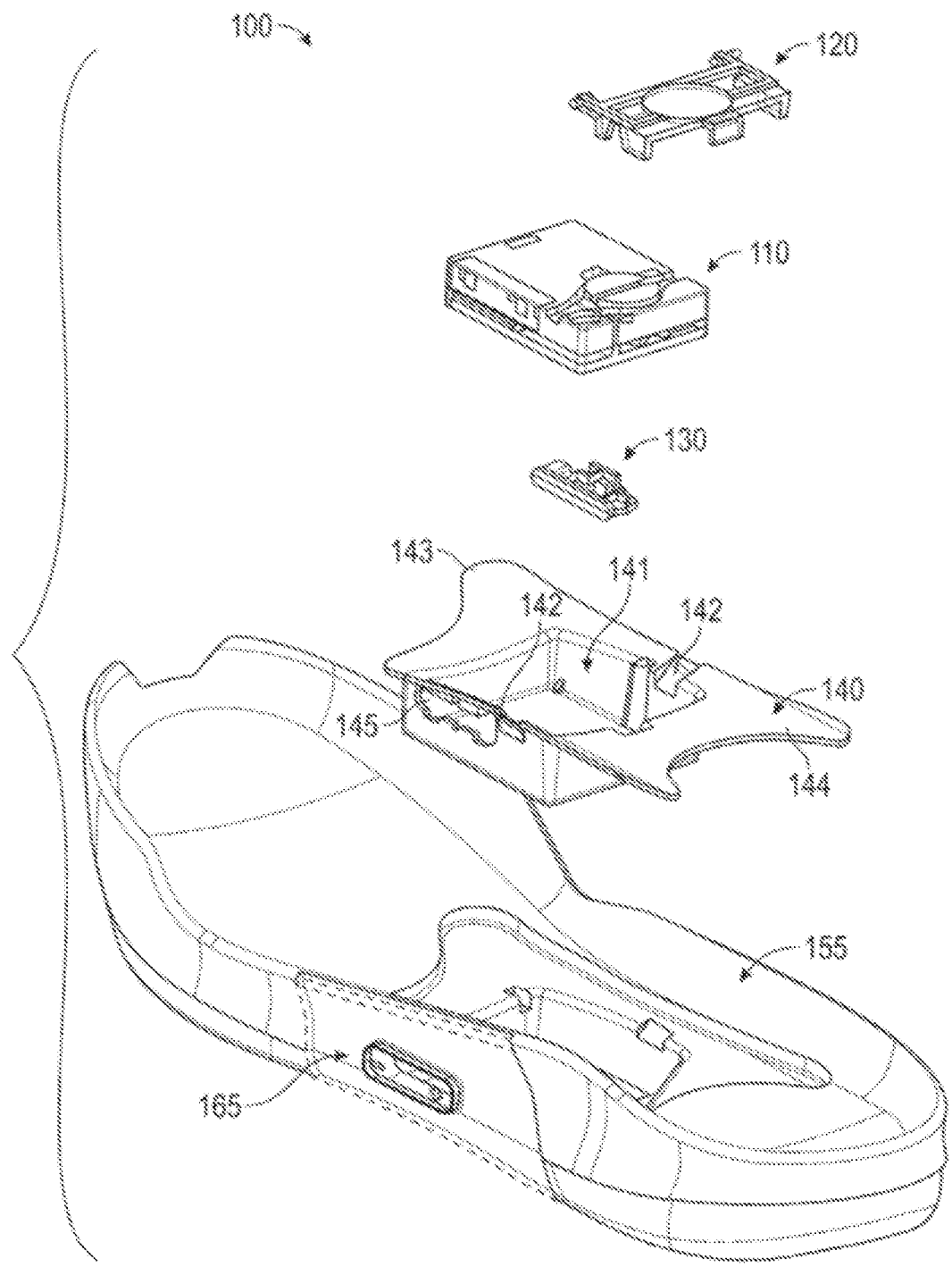
FIG. 1 illustrates generally an example of various components of an article of active footwear.

The concept of self-tightening shoelaces was first widely popularized by the fictitious power-laced Nike® sneakers worn by Marty McFly in the movie Back to the Future II, which was released in 1989. While Nike® has since released various versions of power-laced sneakers similar in appearance to the movie prop version from Back to the Future II, the internal mechanical systems and surround footwear platform employed do not necessarily lend themselves to mass production or daily use. Additionally, previous designs for motorized lacing systems comparatively suffered from problems such as high cost of manufacture, complexity, assembly challenges, lack of serviceability, and weak or fragile mechanical mechanisms. The present inventors have developed a modular footwear platform to accommodate motorized and non-motorized lacing engines that solves some or all of the problems discussed above, among others. The components discussed below provide various benefits including, but not limited to, serviceable components, interchangeable automated lacing engines, robust mechanical design, robust control algorithms, reliable operation, streamlined assembly processes, and retail-level customization.

In an example, a modular automated lacing footwear platform includes a mid-sole plate secured to a mid-sole in a footwear article for receiving a lacing engine. The design of the mid-sole plate allows a lacing engine to be added to the footwear platform as late as at a point of purchase. The mid-sole plate, and other aspects of the modular automated footwear platform, allow for different types of lacing engines to be used interchangeably. For example, the motorized lacing engine discussed below could be changed out for a human-powered lacing engine. Alternatively, a fully-automatic motorized lacing engine with foot presence sensing or other features can be accommodated within the standard mid-sole plate.

The automated footwear platform discussed herein can include an outsole actuator interface to provide tightening control to the end user as well as visual feedback, for example, using LED lighting projected through translucent protective outsole materials. The actuator can provide tactile and visual feedback to the user to indicate status of the lacing engine or other automated footwear platform components.

In an example, the footwear platform includes a foot presence sensor configured to detect when a foot is present in the shoe and to detect an absolute or relative position of a foot, or of a particular portion of a foot or ankle, inside the shoe. When a foot is detected, then one or more footwear functions or processes can be initiated, such as automatically and without a further user input or command. For example, upon detection that a foot is properly seated in the footwear against an insole, a control circuit can automatically initiate lace tightening, data collection, footwear diagnostics, or other processes.

Prematurely activating or initiating an automated lacing or footwear tightening mechanism can potentially inhibit or prevent a user from inserting a foot or donning the footwear. For example, if a lacing engine is activated before a foot is completely seated against an insole, then the user may have a difficult time getting a remainder of his or her foot into the footwear, or the user may have to manually adjust a lacing tension. The present inventors have thus recognized that a problem to be solved includes determining whether a foot is seated properly or seated fully inside a footwear article, such as with toe, mid-sole (i.e., arch), and heel portions properly aligned with corresponding portions of an insole or internal footwear cavity. The inventors have further recognized that the problem includes accurately determining a foot location or foot orientation using as few sensors as possible, such as to reduce sensor costs and assembly costs, and to reduce device complexity.

A solution to these problems includes providing or using a foot presence sensor. In an example, the sensor is configured to generate an electric field, or multiple electric fields, and sense changes or interruptions in the field(s). Changes in the electric field, or capacitance changes, can be realized as a foot enters or exits the footwear, including while some portions of the foot are at a greater distance from the sensor than other portions of the foot. In an example, the sensor is integrated with or housed within a lacing engine enclosure. In an example, at least a portion of the sensor is provided outside of the lacing engine enclosure and includes one or more conductive interconnects to power storage or processing circuitry inside the enclosure.

A sensor suitable for use in foot presence detection can have various configurations. For example, the sensor can include a plate capacitor with at least one plate configured to move relative to another, such as in response to pressure or to a change of pressure exerted on one or more of the plates. In an example, the sensor can include multiple conductive traces, such as arranged substantially in a plane that is parallel to or coincident with a foot-facing surface of the footwear, such as an upper surface of an insole, an under surface of a tongue, or a inner side surface of the footwear upper. Such traces can be laterally separated by an air gap (or other insulating material, such as a circuit board substrate) and can be driven selectively or periodically by an electrical drive signal provided by an excitation circuit. In an example, the electrodes can include interleaved conductive traces, a comb configuration, or a concentric ring or coaxial configuration, or other configuration. The sensor can provide a time-varying signal that is based on, e.g., movement of the electrodes themselves relative to one another and/or is based on interference in the electric field near the electrodes due to presence, absence, or movement of a foot, of the footwear, or of another object.

In an example, the foot presence sensor provides an analog electric output signal indicative of a magnitude of a capacitance, or indicative of a change of capacitance, that is detected by the sensor. The output signal can have a first value (e.g., corresponding to a low capacitance) when a foot is present near the sensor, and the output signal have a different second value (e.g., corresponding to a high capacitance) when a foot is absent.

In an example, the foot presence sensor signal can provide information other than foot presence or foot position information. For example, there can be a detectable variation in the sensor signal that correlates to user sit/stand events or other user posture change events, step events, or other events. In addition, there can be a detectable long-term drift in the signal that can indicate wear-and-tear and/or remaining life in shoe components like insoles, orthotics, or other components.

In an example, the foot presence sensor includes or is coupled to an analog-to-digital (e.g., analog capacitance-indicating signal-to-digital) converter circuit configured to provide a digital signal indicative of a magnitude of a capacitance sensed by the sensor. In an example, the sensor includes or is coupled to a local or remote processor circuit configured to provide an interrupt signal or logic signal that indicates whether a sensed value meets a specified threshold condition. In an example, the sensor measures a capacitance characteristic relative to a baseline or reference capacitance value, and the baseline or reference can be updated or adjusted such as to accommodate environment changes or other changes that can influence sensed capacitance values.

In an example, the foot presence sensor is provided under-foot near an arch or heel region of an insole of a shoe. The sensor can be provided elsewhere, such as in an ankle region, at a footwear tongue region, or other region of a shoe. The sensor can be substantially planar or flat. In an example, the sensor can be rigid or can be flexible and configured to conform to contours of a foot or footbed. In some cases, an air gap, such as can have a relatively low dielectric constant or low relative permittivity, can be provided between a portion of the sensor and the foot when the shoe is worn. A gap filler, such as can have a relatively high dielectric constant or greater relative permittivity than air, can be provided above the capacitive sensor in order to bridge any airspace between the sensor and a foot surface. The gap filler can be compressible or incompressible. In an example, the gap filler is selected to provide a suitable compromise between dielectric value and suitability for use in footwear in order to provide a sensor with adequate sensitivity and user comfort under foot.

The following discusses various components of an automated footwear platform including a motorized lacing engine, a foot presence sensor, a mid-sole plate, and various other components of the platform. While much of this disclosure focuses on foot presence sensing as a trigger for a motorized lacing engine, many aspects of the discussed designs are applicable to a human-powered lacing engine, or other circuits or features that can interface with a foot presence sensor, such as to automate other footwear functions like data collection, physiologic monitoring, or as an input or output relative to a virtual environment or metaverse. The term "automated," such as used in "automated footwear platform," is not intended to cover only a system that operates without a specified user input. Rather, the term "automated footwear platform" can include various electrically powered and human-powered, automatically activated and human activated, mechanisms for tightening a lacing or retention system of the footwear, or for controlling other aspects of active footwear or components functionally coupled thereto. In an example, the automated footwear platform is configured to interface with one or more digital worlds, such as by providing a tangible interface to a user's digital avatar.

FIG. 1 illustrates generally an exploded view of components of an active footwear article, according to an example embodiment, The example of FIG. 1 includes a motorized lacing system 100 with a lacing engine 110, a lid 120, an actuator 130, a mid-sole plate 140, a footwear mid-sole 155, and an outsole 165. The lacing engine 110 can include a user-replaceable component in the system 100, and can include or can be coupled to one or more foot presence sensors. In an example, the lacing engine 110 includes, or is coupled to, a capacitive foot presence sensor. The capacitive foot presence sensor, not shown in the example of FIG. 1, can include multiple electrodes. The electrodes can be provided in various configurations on or around the footwear article. In one example, one or more of the electrodes can be provided on a foot-facing side of the lacing engine 110. In an example, the electrodes of the capacitive foot presence sensor can be housed within the lacing engine 110, can be integrated with the housing of the lacing engine 110, or can be disposed elsewhere near the lacing engine 110 and coupled to power or processing circuitry inside of the lacing engine 110 using one or more electrical conductors.

In an example, the motorized lacing system 100 can be assembled by securing the mid-sole plate 140 to the mid-sole 155. Next, the actuator 130 can be inserted into an opening in a lateral side of the mid-sole plate 140, such as opposite to interface buttons that can be embedded in the outsole 165. Next, the lacing engine 110 can be inserted into the mid-sole plate 140. In an example, the lacing engine 110 can be coupled with one or more sensors that are disposed elsewhere in the footwear. Other assembly methods can be similarly performed to construct the motorized lacing system 100. The described assembly method is provided for example and without limitation, and alternative methods are contemplated.

In an example, the lacing system 100 is inserted with a continuous loop of lacing cable and the lacing cable is aligned with a spool in the lacing engine 110. To complete the assembly, the lid 120 can be inserted into receiving means in the mid-sole plate 140, secured into a closed position, and latched into a recess in the mid-sole plate 140. The lid 120 can capture the lacing engine 110 and, in an example, can help maintain alignment of a lacing cable during operation.

The mid-sole plate 140 includes a lacing engine cavity 141, medial and lateral lace guides 142, an anterior flange 143, a posterior flange 144, superior (top) and inferior (bottom) surfaces, and an actuator cutout 145. The lacing engine cavity 141 is configured to receive the lacing engine 110. In this example, the lacing engine cavity 141 retains the lacing engine 110 in lateral and anterior/posterior directions, but does not include a feature to lock the lacing engine 110 into the cavity 141. Optionally, the lacing engine cavity 141 includes detents, tabs, or other mechanical features along one or more sidewalls to securely retain the lacing engine 110 within the lacing engine cavity 141.

The lace guides 142 can assist in guiding a lacing cable into position with the lacing engine 110. The lace guides 142 can include chamfered edges and inferiorly slanted ramps to assist in guiding a lace, or lacing cable, into a desired position with respect to the lacing engine 110. In this example, the lace guides 142 include openings in the sides of the mid-sole plate 140 that are many times wider than a typical lacing cable diameter, however other dimensions can be used.

In the example of FIG. 1, the mid-sole plate 140 includes a sculpted or contoured anterior flange 143 that extends further on a medial side of the mid-sole plate 140. The example anterior flange 143 is designed to provide additional support under the arch of the footwear platform. However, in other examples the anterior flange 143 may be less pronounced on the medial side. In this example, the posterior flange 144 includes a contour with extended portions on both medial and lateral sides. The illustrated posterior flange 144 can provide enhanced lateral stability for the lacing engine 110.

In an example, one or more electrodes can be embedded in or disposed on the mid-sole plate 140, and can form a portion of a foot presence sensor, such as a portion of a capacitive foot presence sensor. In an example, the lacing engine 110 includes a sensor circuit that is electrically coupled to the one or more electrodes on the mid-sole plate 140. The sensor circuit can be configured to use electric field or capacitance information sensed from the electrodes to determine whether a foot is present or absent in a region adjacent to the mid-sole plate 140. That is, the sensor can be configured to sense information about whether a foot is present in a foot-receiving cavity or void inside the footwear article. In an example, the electrodes extend from an anterior-most edge of the anterior flange 143 to a posterior-most edge of the posterior flange 144, and in other examples the electrodes extend over part of one or both of the flanges.

In an example, the footwear or the motorized lacing system 100 includes or interfaces with one or more sensors that can monitor or determine a foot presence in the footwear, foot absence from the footwear, or foot position characteristic within the footwear. Based on information from one or more such foot presence sensors, the footwear including the motorized lacing system 100 can be configured to perform various functions. For example, a foot presence sensor can be configured to provide binary information about whether a foot is present or not present in the footwear. In an example, a processor circuit coupled to the foot presence sensor receives and interprets digital or analog signal information and provides the binary information about whether a foot is present or not present in the footwear. If a binary signal from the foot presence sensor indicates that a foot is present, then the lacing engine 110 in the motorized lacing system 100 can be activated, such as to automatically increase or decrease a tension on a lacing cable, or other footwear constricting means, such as to tighten or relax the footwear about a foot. In an example, the lacing engine 110, or other portion of a footwear article, includes a processor circuit that can receive or interpret signals from the foot presence sensor and initiate various responsive actions.

In an example, a foot presence sensor can be configured to provide information about a location of a foot as it enters footwear. The motorized lacing system 100 can generally be activated, such as to tighten a lacing cable, only when a foot is appropriately positioned or seated in the footwear, such as against all or a portion of the insole. A foot presence sensor that senses information about a foot travel or location can provide information about whether a foot is fully or partially seated such as relative to an insole or relative to some other feature of the footwear article. Automated lacing procedures can be interrupted or delayed until information from the sensor indicates that a foot is in a proper position.

In an example, a foot presence sensor can be configured to provide information about an absolute or relative location of a foot inside of footwear. For example, the foot presence sensor can be configured to sense whether the footwear is a good "fit" for a given foot, such as by determining a relative position of one or more of a foot arch, heel, toe, or other component, such as relative to the corresponding portions of the footwear that are configured to receive such foot components. In an example, the foot presence sensor can be configured to sense whether a position of a foot or a foot component changes over time relative to a specified or previously-recorded reference position, such as due to loosening of a lacing cable over time, or due to natural expansion and contraction of a foot itself.

In an example, a foot presence sensor can include an electrical, magnetic, thermal, capacitive, pressure, optical, or other sensor device that can be configured to sense or receive information about a presence or proximity of a body. For example, an electrical sensor can include an impedance sensor that is configured to measure an impedance characteristic between at least two electrodes. When a body such as a foot is located proximal or adjacent to the electrodes, the electrical sensor can provide a sensor signal having a first value, and when a body is located remotely from the electrodes, the electrical sensor can provide a sensor signal having a different second value. For example, a first impedance value can be associated with an empty footwear condition, and a lesser second impedance value can be associated with an occupied footwear condition.

In an example, a foot presence sensor can include an AC signal generator circuit and an antenna that is configured to emit or receive high frequency signal information, such as including radio frequency information. Based on proximity of a body relative to the antenna, one or more electrical signal characteristics, such as impedance, frequency, or signal amplitude, can be received and analyzed to determine whether a body is present. In an example, a received signal strength indicator (RSSI) provides information about a power level in a received radio signal. Changes in the RSSI, such as relative to some baseline or reference value, can be used to identify a presence or absence of a body. In an example, WiFi frequencies can be used, for example in one or more of 2.4 GHz, 3.6 GHz, 4.9 GHz, 5 GHz, and 5.9 GHz bands. In an example, frequencies in the kilohertz range can be used, for example, around 400 kHz. In an example, power signal changes can be detected in milliwatt or microwatt ranges.

Any of multiple different types of foot presence sensors (e.g., sensors configured to measure capacitance, impedance, magnetic field, temperature, light, pressure, etc.) can be used independently, or information from two or more different sensors or sensor types can be used together to provide more information about a foot presence, absence, orientation, goodness-of-fit with the footwear, or other information about a foot and/or its relationship with the footwear.

Figure 2A:
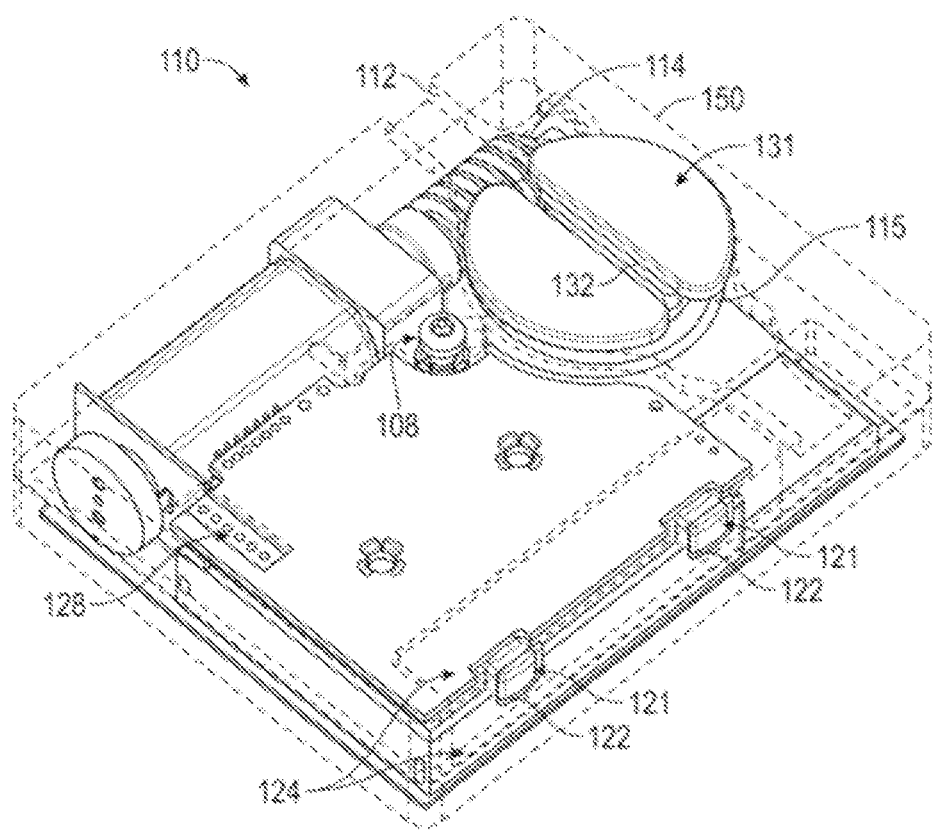
FIG. 2A, FIG. 2B, and FIG. 2C illustrate generally a sensor system and motorized lacing engine for footwear.
Figure 2B:
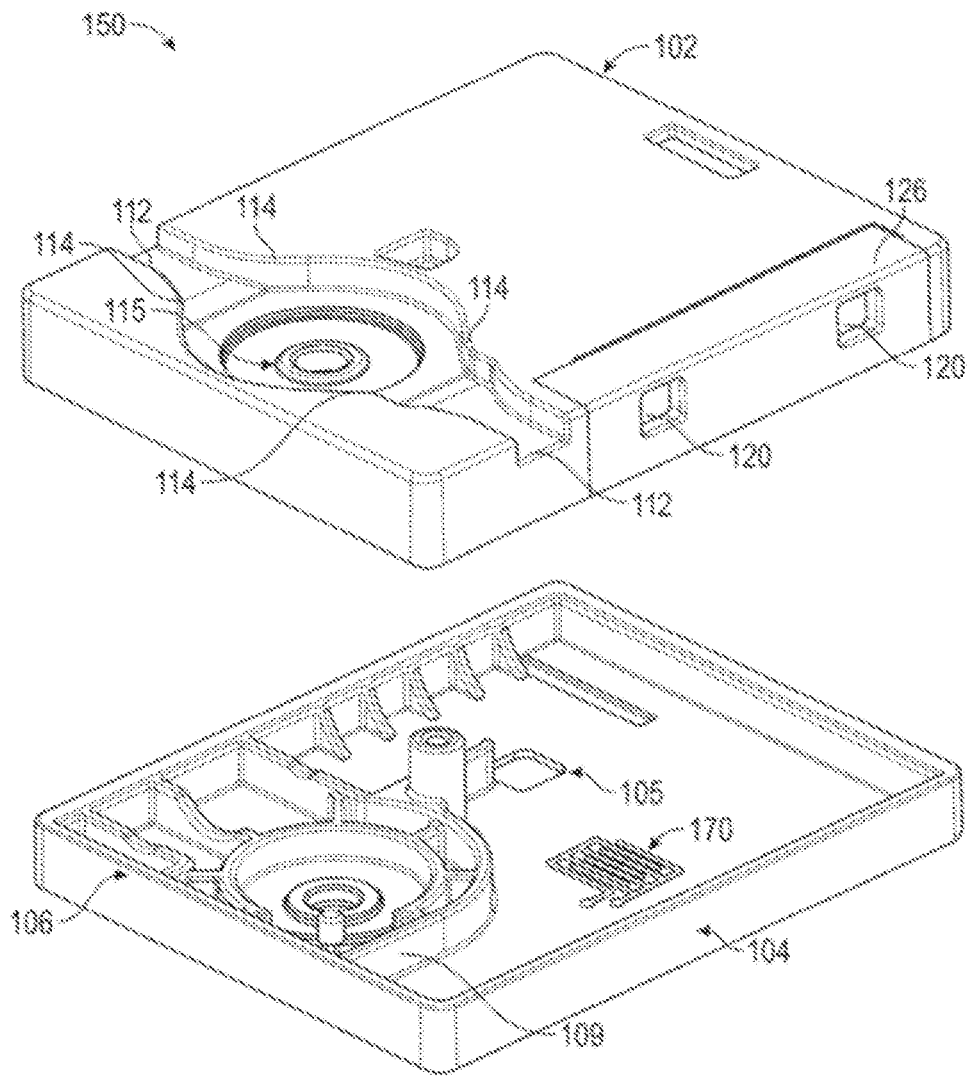
Figure 2C:
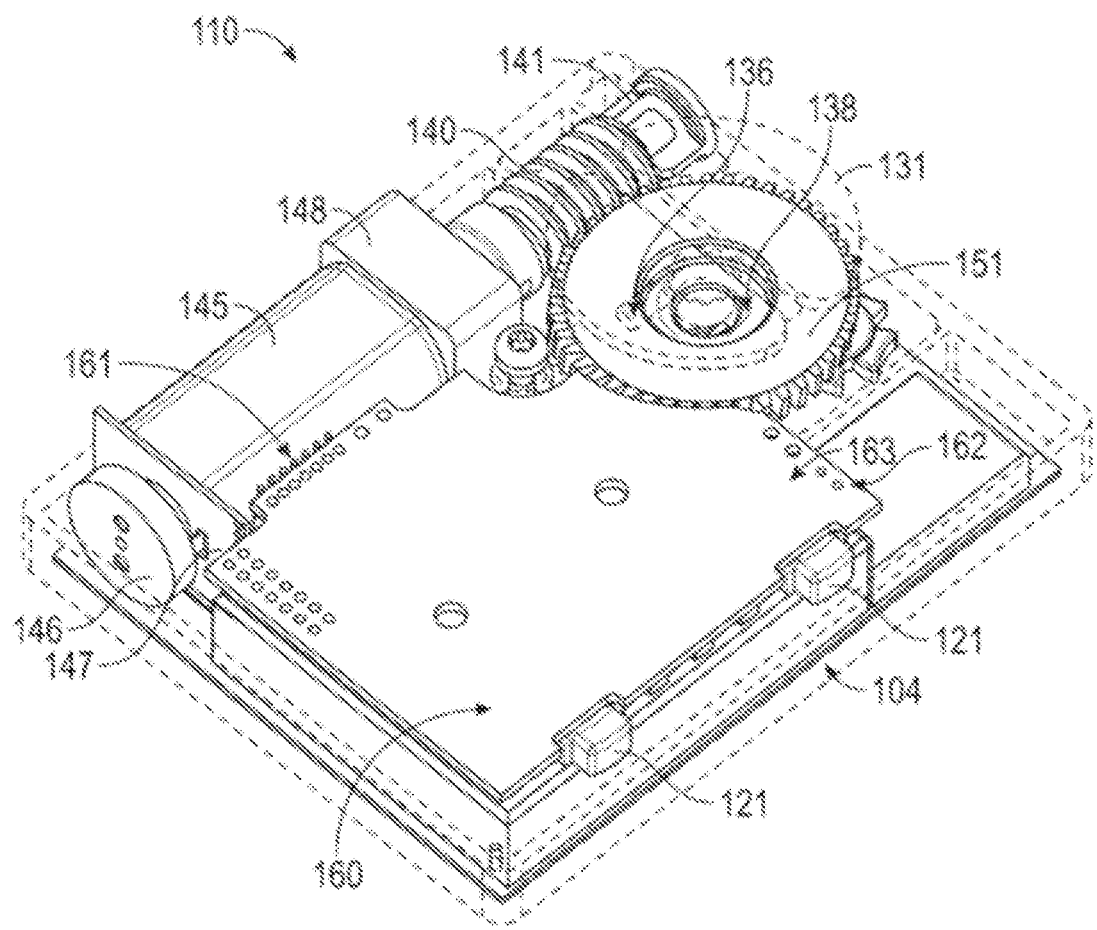

FIGS. 2A-2C illustrate generally a sensor system and motorized lacing engine, according to some example embodiments. FIG. 2A introduces various features of an example of the lacing engine 110, including a housing structure 150, case screw 108, lace channel 112 (also referred to as lace guide relief 112), lace channel transition 114, spool recess 115, button openings 122, buttons 121, button membrane seal 124, programming header 128, spool 131, and lace groove 132 in the spool 131. Other designs can similarly be used. For example, other switch types can be used, such as sealed dome switches, or the membrane seal 124 can be eliminated, etc. In an example, the lacing engine 110 can include one or more interconnects or electrical contacts for interfacing circuitry internal to the lacing engine 110 with circuitry outside of the lacing engine 110, such as an external foot presence sensor or component thereof, an external actuator like a switch or button, or other devices or components.

The lacing engine 110 can be held together by one or more screws, such as the case screw 108. The case screw 108 can be positioned near the primary drive mechanisms to enhance structural integrity of the lacing engine 110. The case screw 108 also functions to assist the assembly process, such as holding the housing structure 150 together for ultra-sonic welding of exterior seams.

In the example of FIG. 2A, the lacing engine 110 includes the lace channel 112 to receive a lace or lace cable once the engine is assembled into the automated footwear platform. The lace channel 112 can include a channel wall with chamfered edges to provide a smooth guiding surface against or within which a lace cable can travel during operation. Part of the smooth guiding surface of the lace channel 112 can include a channel transition 114, which can be a widened portion of the lace channel 112 leading into the spool recess 115. The spool recess 115 transitions from the channel transition 114 into generally circular sections that conform closely to a profile of the spool 131. The spool recess 115 can assist in retaining a spooled lace cable, as well as in retaining a position of the spool 131. Other aspects of the design can provide other means to retain the spool 131. In the example of FIG. 2A, the spool 131 is shaped similarly to half of a yo-yo with a lace groove 132 running through a flat top surface and a spool shaft (not shown in FIG. 2A) extending inferiorly from the opposite side.

A lateral side of the lacing engine 110 includes button openings 122 that house buttons 121 that can be configured to activate or adjust one or more features of the automated footwear platform. The buttons 121 can provide an external interface for activation of various switches included in the lacing engine 110. In some examples, the housing structure 150 includes a button membrane seal 124 to provide protection from dirt and water. In this example, the button membrane seal 124 is up to a few mils (thousandths of an inch) thick clear plastic (or similar material) that can be adhered from a superior surface of the housing structure 150, such as over a corner and down a lateral side. In another example, the button membrane seal 124 is an approximately 2-mil thick vinyl adhesive backed membrane covering the buttons 121 and button openings 122. Other types of buttons and sealants can be similarly used.

FIG. 2B is an illustration of housing structure 150 including a top section 102 and a bottom section 104. In this example, the top section 102 includes features such as a recess to receive the case screw 108, lace channel 112, lace channel transition 114, spool recess 115, button openings 122, and a button seal recess 126. In an example, the button seal recess 126 is a portion of the top section 102 that is relieved to provide an inset for the button membrane seal 124.

In the example of FIG. 2B, the bottom section 104 includes features such as a wireless charger access 105, a joint 106, and a grease isolation wall 109. Also illustrated, but not specifically identified, is the case screw base for receiving case screw 108, as well as various features within the grease isolation wall 109 for holding portions of a drive mechanism. The grease isolation wall 109 is designed to retain grease, or similar compounds surrounding the drive mechanism, away from various electrical components of the lacing engine 110.

The housing structure 150 can include, in one or both of the top and bottom sections 102 and 104, one or more electrodes 170 embedded in or applied on a structure surface. The electrodes 170 in the example of FIG. 2B are shown coupled to the bottom section 104. In an example, the electrodes 170 comprise a portion of a capacitance-based foot presence sensor circuit (see, e.g., the body presence sensor 302 discussed herein). Although illustrated as complementary and interleaved conductors, the electrodes 170 can have various shapes, sizes, or orientations, as further detailed herein. Additionally or alternatively, one or more of the electrodes 170 can be coupled to the top section 102. Electrodes 170 coupled to the top and/or bottom sections 102 or 104 can be used for wireless power transfer and/or as a portion of a capacitance-based foot presence sensor circuit. In an example, the electrodes 170 include one or more portions that are disposed on an outside surface of the housing structure 150, and in another example the electrodes 170 include one or more portions that are disposed on an inside surface of the housing structure 150.

FIG. 2C is an illustration of various internal components of the lacing engine 110, according to an example embodiment. In this example, the lacing engine 110 includes a spool magnet 136, O-ring seal 138, worm drive 140, bushing 141, worm drive key, gear box 148, gear motor 145, motor encoder 146, motor circuit board 147, worm gear 151, circuit board 160, motor header 161, battery connection 162, and wired charging header 163. The spool magnet 136 assists in tracking movement of the spool 131 though detection, e.g., by a magnetometer (not shown in FIG. 2C). The o-ring seal 138 seals out dirt and moisture that could migrate into the lacing engine 110 around the spool shaft. The circuit board 160 can include one or more interfaces or interconnects for a foot presence sensor or one or more other sensors. In an example, the circuit board 160 includes one or more traces or conductive planes that provide a portion of a foot presence sensor.

In the illustrated example, major drive components of the lacing engine 110 include the worm drive 140, worm gear 151, gear motor 145 and gear box 148. The worm gear 151 is designed to inhibit back driving of the worm drive 140 and gear motor 145, which means the major input forces coming in from the lacing cable via the spool 131 can be resolved on the comparatively large worm gear and worm drive teeth. This arrangement protects the gear box 148 from needing to include gears of sufficient strength to withstand both the dynamic loading from active use of the footwear platform or tightening loading from tightening the lacing system. The worm drive 140 includes additional features to assist in protecting various fragile portions of the drive system, such as the worm drive key. In this example, the worm drive key is a radial slot in the motor end of the worm drive 140 that interfaces with a pin through the drive shaft coming out of the gear box 148. This arrangement prevents the worm drive 140 from imparting undue axial forces on the gear box 148 or gear motor 145 by allowing the worm drive 140 to move freely in an axial direction (away from the gear box 148), transferring those axial loads onto bushing 141 and the housing structure 150.

Figure 3:
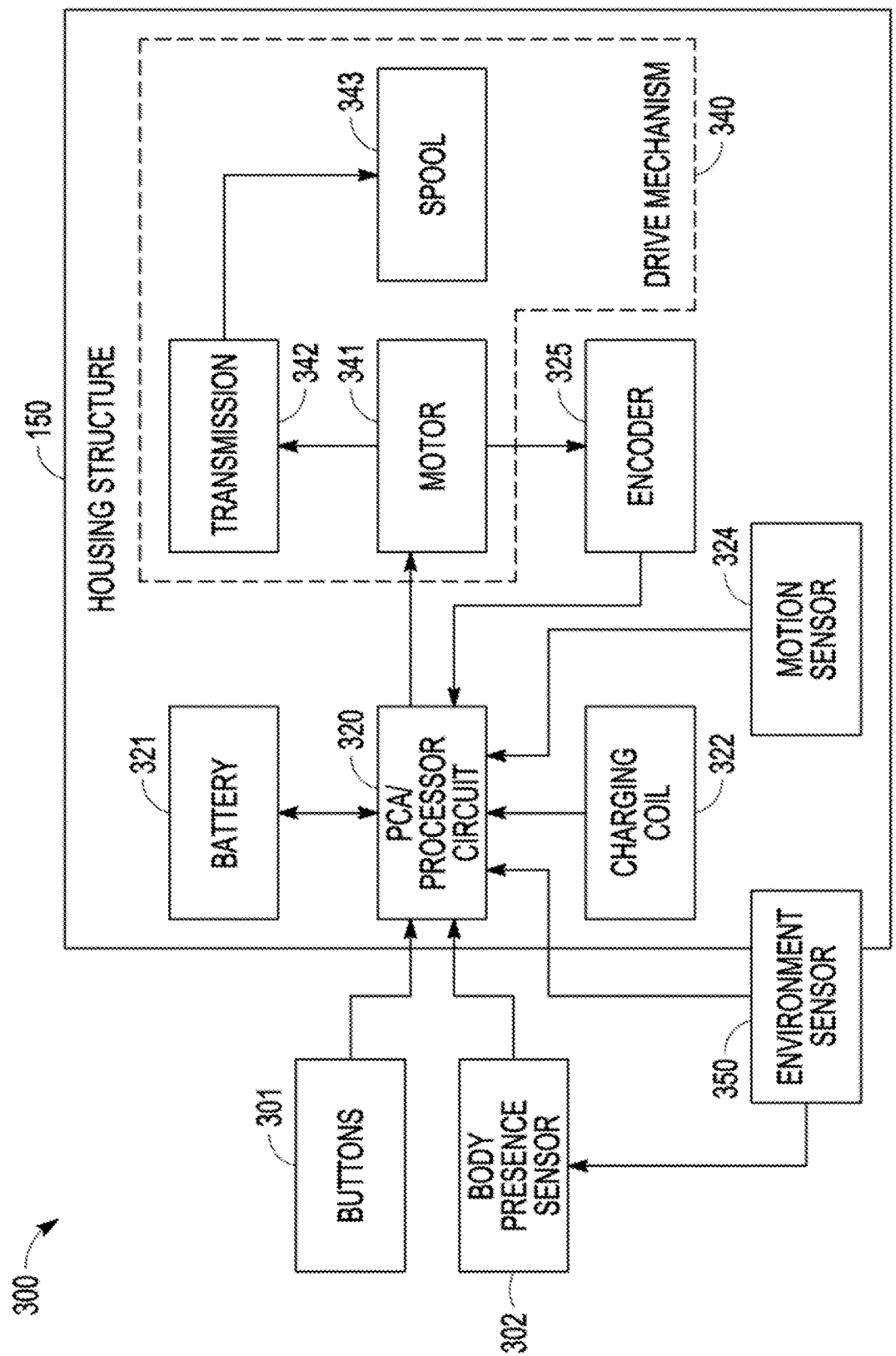
FIG. 3 illustrates generally an example of components of a motorized lacing system.

FIG. 3 illustrates generally a block diagram of components of a motorized lacing system 300, according to an example embodiment. The system 300 includes some, but not necessarily all, components of a motorized lacing system such as including interface buttons 301, a body presence sensor 302, and the housing structure 150 enclosing a printed circuit board assembly (PCBA) with a processor circuit 320, a battery 321, a charging coil 322, an encoder 325, a motion sensor 324, and a drive mechanism 340. The drive mechanism 340 can include, among other things, a motor 341, a transmission 342, and a lace spool 343. The motion sensor 324 can include, among other things, a single or multiple axis accelerometer, a magnetometer, a gyrometer, or other sensor or device configured to sense motion of the housing structure 150, or of one or more components within or coupled to the housing structure 150.

In the example of FIG. 3, the processor circuit 320 (sometimes referred to herein as a control circuit or controller) is in data or power signal communication with one or more of the interface buttons 301, body presence sensor 302, battery 321, charging coil 322, and drive mechanism 340. The transmission 342 couples the motor 341 to the spool 343 to form the drive mechanism 340. As illustrated in the example of FIG. 3, the buttons 301, body presence sensor 302, and environment sensor 350 can be provided outside, or partially outside, the housing structure 150.

In alternative embodiments, one or more of the buttons 301, body presence sensor 302, and environment sensor 350 can be enclosed in the housing structure 150. In an example, the body presence sensor 302 is disposed inside of the housing structure 150 to protect the sensor from perspiration and dirt or debris Minimizing or eliminating connections through the walls of the housing structure 150 can help increase durability and reliability of the assembly.

In an example, the processor circuit 320 controls one or more aspects of the drive mechanism 340. For example, the processor circuit 320 can be configured to receive information from the buttons 301 and/or from the body presence sensor 302 and/or from the motion sensor 324 and, in response, control the drive mechanism 340, such as to tighten or loosen footwear about a foot. In an example, the processor circuit 320 is additionally or alternatively configured to issue commands to obtain or record sensor information, from the body presence sensor 302 or other sensor, among other functions. In an example, the processor circuit 320 conditions operation of the drive mechanism 340 on one or more of detecting a foot presence using the body presence sensor 302, detecting a foot orientation or location using the body presence sensor 302, or detecting a specified gesture using the motion sensor 324.

In an example, the system 300 includes an environment sensor 350. Information from the environment sensor 350 can be used to update or adjust a baseline or reference value for the body presence sensor 302. For example, the body presence sensor 302 can include a capacitive sensor, and capacitance values measured by a capacitive foot presence sensor can vary over time, such as in response to ambient conditions near the sensor. Using information from the environment sensor 350, the processor circuit 320 and/or the body presence sensor 302 can therefore be configured to update or adjust a measured or sensed capacitance value.

In an example, the body presence sensor 302 can be disabled, or signals from the body presence sensor 302 can be ignored by the processor circuit 320 under various conditions. For example, if the drive mechanism 340 is activated and is actively spooling or unspooling, then the processor circuit 320 can be configured to ignore interrupts or other signals from the body presence sensor 302. In an example, if the footwear is being charged, such as using the charging coil 322 or the wired charging header 163, then the processor circuit 320 can be configured to ignore interrupts or other signals from the body presence sensor 302.

Figure 4A:
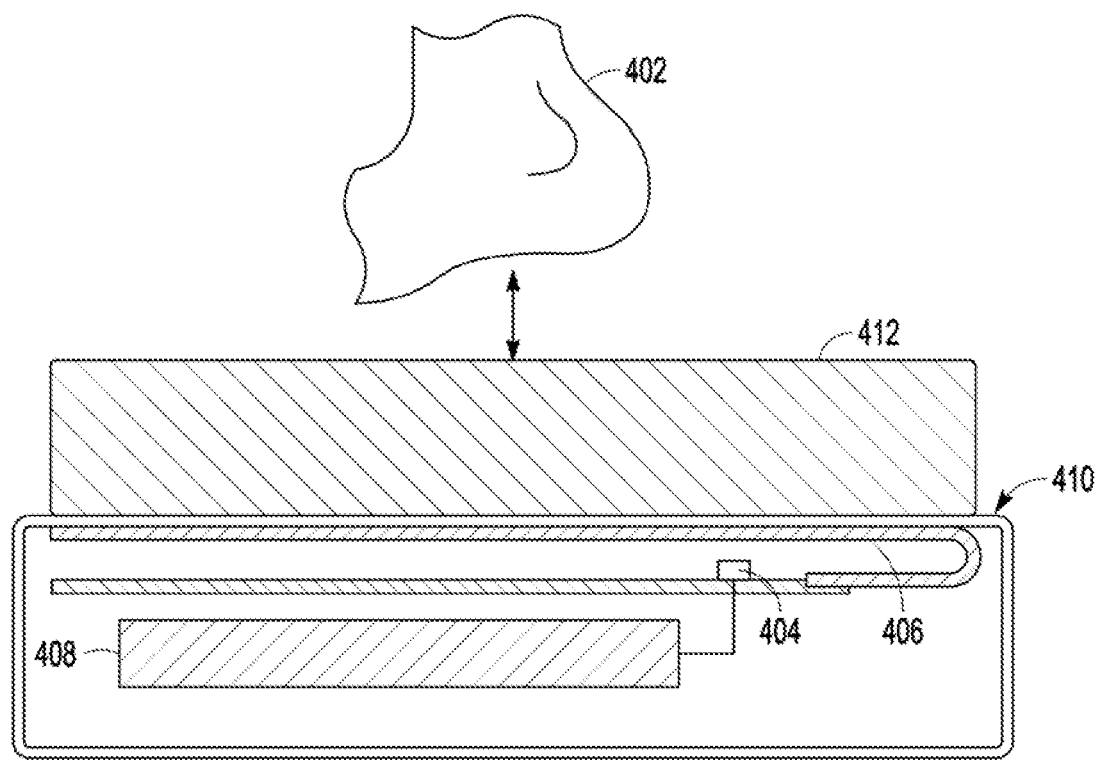
FIG. 4A and FIG. 4B illustrate generally diagrams of a body presence sensor in an insole portion of an article of active footwear.
Figure 4B:
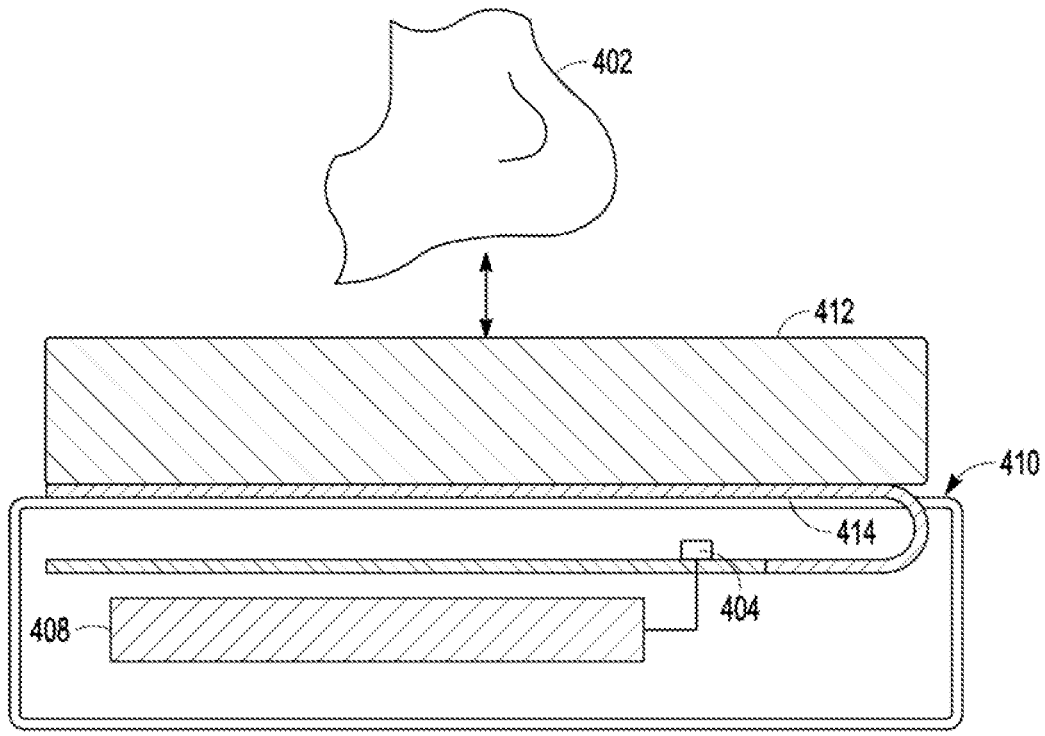

FIG. 4A and FIG. 4B illustrate generally diagrams of a body presence sensor, such as a capacitance-based foot presence sensor for use in an insole of a footwear article, according to example embodiments. The body presence sensor can be provided below a surface of an object or body 402, such as a foot, when the article incorporating the sensor is worn.

In FIG. 4A, the body presence sensor can include a first electrode assembly 406 coupled to a control circuit 404. In an example, the control circuit 404 comprises the processor circuit 320. In the example of FIG. 4A, the first electrode assembly 406 and/or the control circuit 404 can be included in or mounted to an inner portion of a housing 410, such as can comprise the housing structure 150, or can be coupled to the PCBA inside of the housing 410. In an example, the first electrode assembly 406 can be disposed at or adjacent to a foot-facing surface of the housing 410. In an example, the first electrode assembly 406 includes multiple conductors or traces distributed across an internal, upper surface region of the housing 410.

In FIG. 4B, the body presence sensor can include a second electrode assembly 414 coupled to the control circuit 404. The second electrode assembly 414 can be mounted to or near an outer portion of the housing 410, and can be electrically coupled to the PCBA inside of the housing 410, such as using a flexible connector 416. In an example, the second electrode assembly 414 can be disposed at or adjacent to a foot-facing surface of the housing 410. In an example, the second electrode assembly 414 includes a flexible circuit that is secured to an inner or outer surface of the housing 410, and coupled to the control circuit 404 using one or more conductors.

In an example, the control circuit 404 includes a general purpose or purpose-built processor. The control circuit 404 can be configured to, among other things, provide an AC drive signal to a selected pair of multiple electrodes comprising the first electrode assembly 406 or the second electrode assembly 414. In response to the AC drive signal, the control circuit 404 can sense information about changes in an electric field at or adjacent to the electrode assembly, such as based on corresponding changes in proximity of the object or body 402 to the electrodes, as explained in greater detail below.

Various materials can be provided between the body 402 and the electrode assembly, such as the first electrode assembly 406 or the second electrode assembly 414. For example, electrode insulation, a material of the housing 410, an insole material, a dielectric insert 412, a sock or other foot cover, body tape, kinesiology tape, or other materials can be interposed between the body 402 and one or more electrodes, and can change a dielectric characteristic of the footwear and thereby influence a detection sensitivity of the body sensor. The control circuit 404 can be configured to update or adjust an excitation signal or sensing parameter based on the number or type of interposed materials, such as to enhance a sensitivity or signal-to-noise ratio of the sensor.

In the examples of FIG. 4A or FIG. 4B, the first electrode assembly 406 or the second electrode assembly 414 can be excited by a signal generator in the control circuit 404, and as a result an electric field can project at least partially from foot-facing side of the electrode assembly. In an example, an electric field below the electrode assembly can be blocked at least in part using a driven shield positioned below the sensing electrode. The driven shield and electrode assembly can be electrically insulated from each other. For example, if the first electrode assembly 406 is on one surface of the PCBA then the driven shield can be on the bottom layer of the PCBA, or on any one of multiple inner layers on a multi-layer PCBA. In an example, the driven shield can be of equal or greater surface area of the electrodes comprising the first electrode assembly 406 or the second electrode assembly 414, and in some examples, can be centered directly below the electrode assembly.

In an example, the driven shield can receive a drive signal (e.g., from the control circuit 404) and, in response, generate an electric field. The field generated by the driven shield can have substantially the same polarity, phase and/or amplitude of the field generated by the first electrode assembly 406 or the second electrode assembly 414. The field from the driven shield can repel the electric field of other electrode assembly, and can thereby isolate the sensor field from various parasitic effects, such as undesired coupling to a ground plane of the PCBA. The field generated by the driven shield can help direct and focus detection to a particular area, can help reduce environmental effects, and can help reduce parasitic capacitance effects. In an example, including a driven shield and can help reduce effects of temperature variation on the sensor assembly. Temperature can influence a parasitic offset characteristic, and temperature changes, for example, can cause a parasitic ground plane capacitance to change. Using a shield, such as inserted between the sensor electrode and ground, can help mitigate an influence of a parasitic ground plane capacitance from sensor measurements.

In an example, a preferred position in which to locate the housing 410 is in an arch area of footwear because it is an area less likely to be felt by or cause discomfort to a wearer. One advantage of using capacitive sensing for detecting foot presence in footwear includes that a capacitive sensor can function well even when the sensor is disposed in an arch region and a user has a relatively or unusually high foot arch. For example, a sensor drive signal amplitude or morphology characteristic can be changed or selected based on a desired signal-to-noise ratio of a signal received from a capacitive sensor. In an example, the sensor drive signal can be updated or adjusted each time footwear is used, such as to accommodate changes in one or more materials (e.g., socks, insoles, etc.) disposed between the body 402 and the body sensor electrode assembly.

In an example, an electrode assembly of a capacitive sensor, such as the first electrode assembly 406 or the second electrode assembly 414, can comprise multiple different electrodes that can be selectively coupled or decoupled to form various electrode pairs that can be separately driven or separately used as sensors. For example, different pairs can be configured to sense respective signals and a difference between the signals can be used to determine various characteristics of the foot or the footwear. In an example, the electrodes comprising the different electrode pairs can be oriented along different axes or can be generally concentric or adjacent electrodes.

Figure 5A:
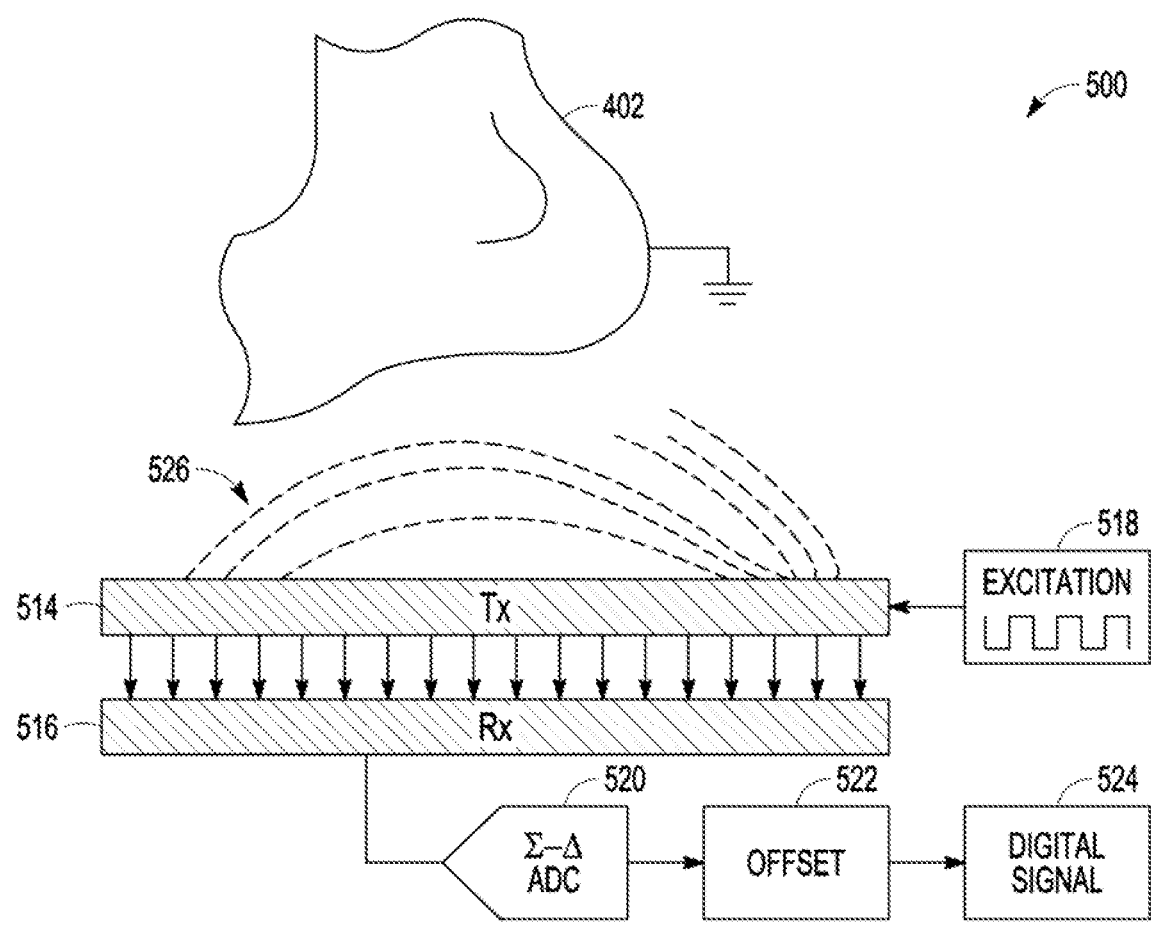
FIG. 5A illustrates generally an example of a capacitive sensor system.

FIG. 5A illustrates generally a capacitive sensor system 500 for body or foot presence detection, according to an example embodiment. The example of the capacitive sensor system 500 includes the body 402 (e.g., representing a foot in or near an active footwear article) and a first electrode 514 and a second electrode 516. In an example, the first electrode 514 and/or the second electrode 516 can comprise the first electrode assembly 406 or the second electrode assembly 414 or a different assembly of the body presence sensor 302. Each of the electrodes can include a plate, trace, or other conductor comprising a conductive material such as copper, carbon, silver, or a conductive foil, among other conductive materials. In an example, any conductive material can be used for the electrodes, including conductive films, inks, deposited metals, or other materials.

In the example of FIG. 5A, the first electrode 514 and the second electrode 516 are illustrated as being vertically spaced relative to one another (and to the body 402), however, the electrodes can similarly be horizontally spaced or otherwise offset or spaced apart. In an example, the electrodes can be disposed in a plane that is generally or approximately parallel to a lower surface of the body 402 to be detected. That is, at least a portion of the electrodes can include a surface that is parallel to a corresponding lower portion or surface of the body 402. In some examples, the electrodes can be contoured or formed, for example, to correspond to a curved or arched region of a foot. In the example of FIG. 5A, the first electrode 514 is configured as a driven or transmit electrode and is coupled to a signal generator that provides an excitation signal 518. In an example, the signal generator comprises a portion of the control circuit 404.

As a result of exciting the electrodes using the excitation signal 518, an electric field 526 can be generated primarily between the first electrode 514 and the second electrode 516. That is, various components of the generated electric field 526 can extend between the electrodes, and other fringe components of the generated electric field 526 can extend in other directions. For example, the fringe components can extend from the transmitter electrode or first electrode 514 away from the housing 410 (not pictured in the example of FIG. 5A) and can terminate back at the receiver electrode or second electrode 516 or elsewhere.

Information about the electric field 526, including information about changes or interruptions in the field due to proximity of the body 402, can be sensed or received, e.g., using the second electrode 516. Signals sensed from the second electrode 516 can be processed using various circuitry (e.g., using the control circuit 404) and can be used to provide an analog or digital signal indicative of presence or absence of the body 402.

For example, a field strength of the electric field 526 as detected by the second electrode 516 can be measured using a sigma-delta analog-to-digital converter circuit 520 (ADC). The ADC can be configured to convert analog capacitance-indicating signals to digital signals. In an example, the electrical environment near the electrodes changes when an object, such as the body 402, invades the electric field 526, including its fringe components. When the body 402 enters the field, a portion of the electric field 526 is shunted (e.g., grounded or absorbed) instead of being received and terminated at the second electrode 516, or passes through the body 402 (e.g., instead of through air) before being received at the second electrode 516. This field interruption can result in a capacitance change that can be detected by the sensor using the first electrode 514 and the second electrode 516.

In an example, the second electrode 516 can receive electric field information substantially continuously, and the information can be sampled continuously or periodically by the analog-to-digital converter circuit 520. Information from the analog-to-digital converter circuit 520 can be processed using a filter circuit 522, such as to introduce an offset or calibration factor. Then, the system can provide a digital output signal 524. In an example, the filter circuit 522 can introduce a capacitance offset that can be specified or programmed (e.g., internally to the control circuit 404) or can be based on another capacitor used for tracking environmental changes over time, temperature, and other variable characteristics of an environment.

In an example, the digital output signal 524 can include binary information about a determined presence, absence, or position of the body 402 such as by comparing a measured value to a specified threshold value. In an example, the digital output signal 524 includes qualitative information about a measured capacitance, such as can be used (e.g., by the control circuit 404) to provide an indication of a likelihood that the body 402 is or is not present.

Periodically, or if the body presence sensor 302 is not active (e.g., as determined using information from the motion sensor 324), a capacitance-indicating value can be measured and stored as a reference value, baseline value, or ambient value. When a foot or body (e.g., the body 402) approaches the body presence sensor 302 and its electrodes, the measured capacitance can decrease or increase, such as relative to the stored reference value. In an example, one or more threshold capacitance levels can be stored, e.g., in on-chip registers with the control circuit 404. When a measured capacitance value exceeds a specified threshold, then the body 402 can be determined to be present (or absent) from footwear containing the body presence sensor 302.

The body presence sensor 302, and the various electrodes comprising the body presence sensor 302, can take various different forms, such as illustrated in the several non-limiting examples that follow. In an example, the electrodes of the body presence sensor 302 can be arranged in a grid pattern. In examples in which the body presence sensor 302 is a capacitive sensor, the sensor electrode grid can includes a variable capacitor at each intersection of each row and each column of the grid. Optionally, the electrode grid includes electrodes arranged in one or multiple rows or columns. A voltage signal can be applied to the rows or columns, and a body or foot near the surface of the sensor can influence a local electric field and, in turn, can reduce a mutual capacitance effect. In an example, a capacitance change at multiple points on the grid can be measured to determine a body location relative to the grid, or relative to the article of footwear, such as by measuring a voltage in each axis. In an example, mutual capacitance measuring techniques can provide information from multiple locations around the grid at the same time.

In an example, a mutual capacitance measurement uses an orthogonal grid of transmit and receive electrodes. In such a grid-based sensor system, measurements can be detected for each of multiple discrete X-Y coordinate pairs. In an example, capacitance information from multiple capacitors can be used to determine foot presence or foot orientation in footwear. In another example, capacitance information from one or more capacitors can be acquired over time and analyzed to determine a foot presence or foot orientation. In an example, rate of change information about X and/or Y detection coordinates can be used to determine when or if a foot is properly or completely seated with respect to an insole in footwear.

In an example, a body presence sensor 302 including a self-capacitance based foot presence sensor can have the same X-Y grid as a body presence sensor 302 including a mutual capacitance sensor, but the columns and rows can operate independently. In a self-capacitance sensor, capacitive loading of a body at each column or row can be detected independently.

Figure 5B:
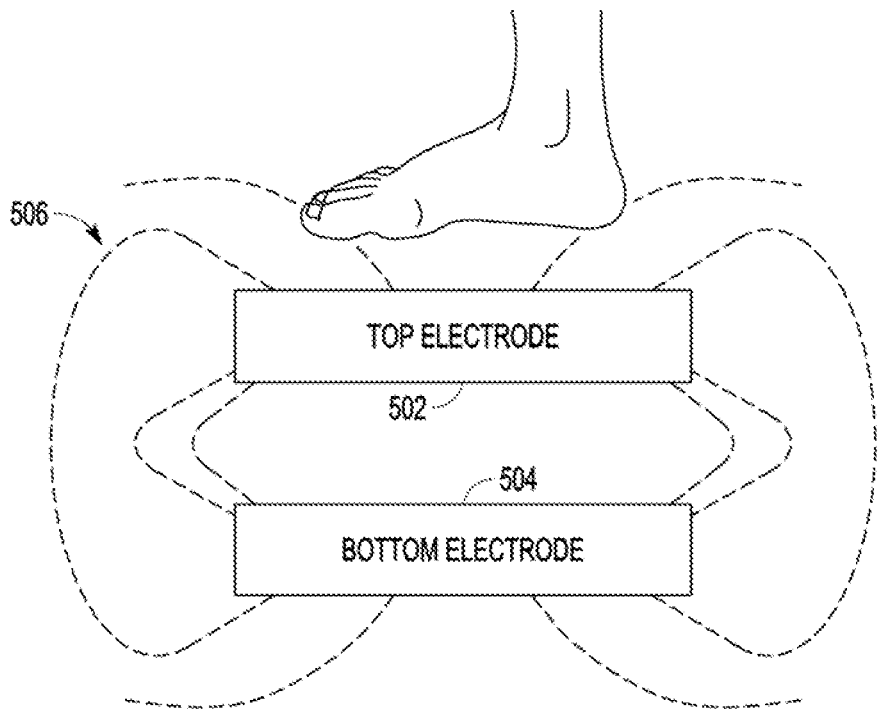
FIG. 5B illustrates generally an example of an electric field generated by a first capacitive sensor system.
Figure 5C:
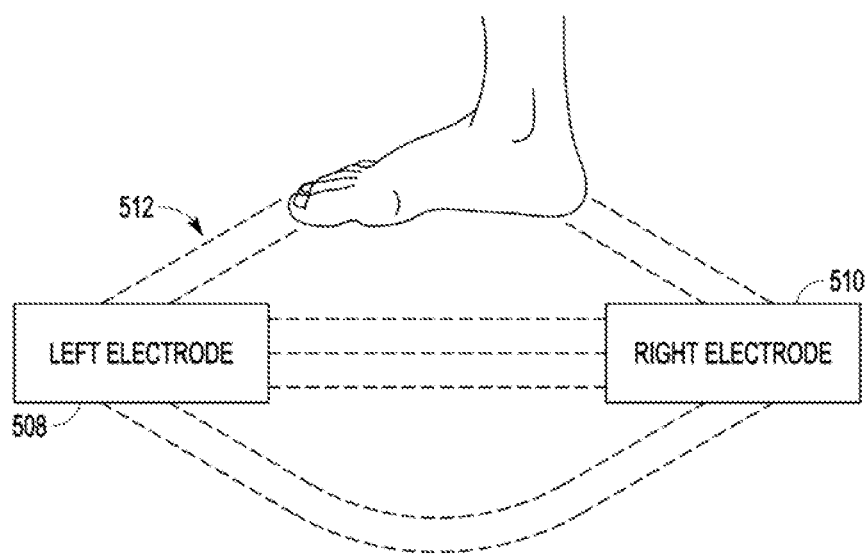
FIG. 5C illustrates generally an example of an electric field generated by a second capacitive sensor system.

FIG. 5B and FIG. 5C illustrate generally examples of different configurations of electrodes that can comprise the body presence sensor 302. The figures illustrate depictions of generated electrostatic or electric fields from the different electrode configurations. For each pair of electrodes, or of capacitor plates, an effective dielectric between the electrodes includes an airgap (or other material) disposed between the electrodes. For each electrode pair, any portion of a body or foot that is proximal thereto can become part of, or can influence, an effective dielectric for the given pair. That is, a variable dielectric can be provided between each electrode pair according to a proximity of a body to the respective electrodes. For example, the closer a body or foot is to a given pair of electrodes, the greater the value of the effective dielectric may be. As the dielectric constant value increases, the capacitance value increases. Such a capacitance value change can be received by the processor circuit 320 and used to indicate whether a body is present at or near the body presence sensor 302.

FIG. 5B illustrates a vertically stacked electrode configuration similar to that shown in the example of FIG. 5A. The example of FIG. 5B includes a top electrode 502 and a bottom electrode 504. When the top electrode 502 and the bottom electrode 504 are coupled to receive respective portions of an AC drive signal (e.g., comprising the excitation signal 518), then a first projected electric field 506 can be provided. The first projected electric field 506 can include field lines or field components that extend in three dimensions, including components that extend linearly or laterally between the top electrode 502 and the bottom electrode 504 as illustrated. Some field components can extend away from or about the edges of the electrodes, as illustrated by the lines extending to the left or to the right of the top electrode 502 and the bottom electrode 504. It will be appreciated that some components extend into or away from the page to provide the three-dimensional field. The shape of the first projected electric field 506 can be generally spherical or can be non-spherical, and can be contoured according to, e.g., the dimensions or positions or orientations of the various electrodes that contribute to or that are configured to selectively impede the field (e.g., passively or actively).

FIG. 5C illustrates a horizontally spaced electrode configuration. The example of FIG. 5C includes a left electrode 508 and a right electrode 510. When the left electrode 508 and the right electrode 510 are coupled to receive respective portions of an AC drive signal (e.g., comprising the excitation signal 518), then a second projected electric field 512 can be provided. The second projected electric field 512 can include field lines or field components that extend in three dimensions, including components extending linearly or laterally between the left electrode 508 and the right electrode 510 as illustrated. It will be appreciated that some components extend into or away from the page to provide the three-dimensional field, as similarly described above.

In an example, a dielectric member, such as the dielectric insert 412, can be provided between the body 402 and one or more of the electrodes of the body presence sensor 302. The dielectric member can have a dielectric permittivity that is the same or greater than the permittivity of air (e.g., k=1.0). The dielectric member can augment the sensitivity of the body presence sensor 302 to changes in the position or location of the body 402 by providing a conduit that helps selectively guide the generated electric field(s) toward particular areas. For example, the dielectric member can help concentrate the generated electric field(s) toward a central foot-receiving portion of an article of footwear.

In an example, the dielectric member can augment the sensitivity of the body presence sensor 302 by extending or pushing the electric field(s) outward or sideways, away from the electrodes of the body presence sensor 302. This sensitivity change can be desirable in some circumstances, or can be undesirable if it increases the sensitivity of the body presence sensor 302 or other adjacent materials such as conductive surfaces or liquids upon which or near which an article of footwear can be used. In other words, the augmented sensitivity can be undesirable if it causes false detections of body presence due to environmental changes or due to factors other than, e.g., a foot being provided inside the footwear article.

The present inventors have recognized that a solution to the sensitivity or electric field position problem can include or use the body presence sensor 302 comprising three or more electrodes. The electrodes can be paired in various combinations and driven together, such as in a time-multiplexed manner, to more accurately detect body presence. The present inventors have further recognized that the solution can help improve sensor resistance to perspiration or drift due to other environmental influences. For example, using information about multiple electric fields together can help reduce sensitivity of the body presence sensor 302 to objects at the sides of the sensor, and can help reduce sensitivity to objects that are opposite to a focal region (e.g., an interior of a footwear article) of the sensor.

The present inventors have recognized that a further problem to be solved includes obtaining a suitable sensitivity of or response from a capacitive foot presence sensor, for example, when all or a portion of the foot presence sensor is spaced apart from a foot or body to be detected, such as by an air gap or other intervening material. The present inventors have recognized that a solution can include using multiple electrodes of specified shapes, sizes, and orientations to enhance an orientation and relative strength of an electric field that is produced when the electrodes are energized. That is, the present inventors have identified an optimal electrode configuration for use in capacitive foot presence sensing. The present inventors have further recognized that the solution can include using information from multiple electrode sensing pairs together.

Figure 6:
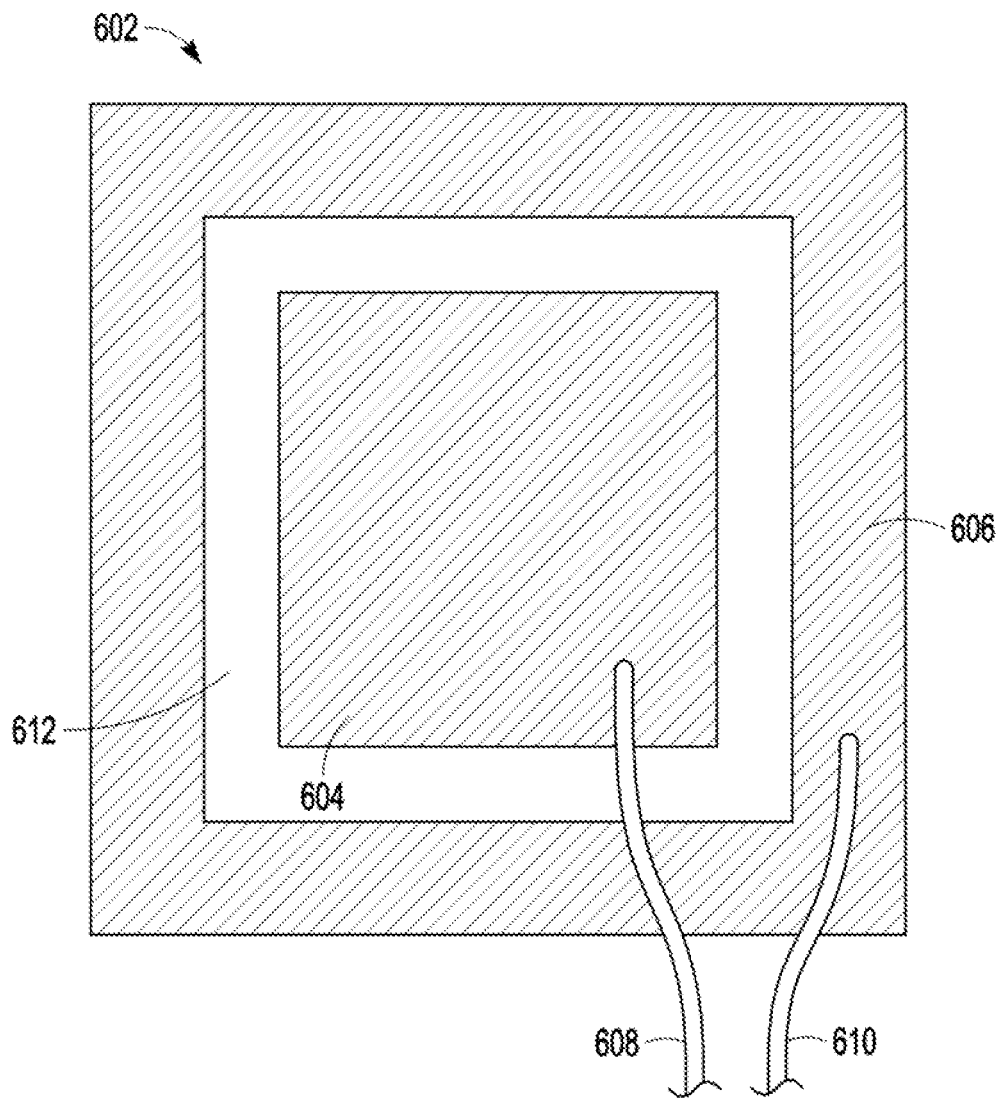
FIG. 6 illustrates generally an example of a first compound electrode assembly.

FIG. 6 illustrates generally an example of a first compound electrode assembly 602 that can include multiple conductors. In an example, the first compound electrode assembly 602 comprises a portion of the body presence sensor 302. The example of the first compound electrode assembly 602 includes a main or central electrode 604 and a ring electrode 606. The ring electrode 606 and the central electrode 604 can be separated by an insulator 612 or non-conductive region. In an example, the ring electrode 606 completely encircles or encloses the central electrode 604, and in other examples, the ring electrode 606 extends partially but not completely around a perimeter of the central electrode 604.

In an example, the central electrode 604 and the ring electrode 606 can be conductive plates or traces that are coplanar and are disposed on a common or shared substrate, such as FR4, Polyimide, PET or other material. Each of the central electrode 604 and the ring electrode 606 can be coupled to drive circuitry to receive an excitation signal, such as the excitation signal 518 from the control circuit 404. Either of the central electrode 604 or ring electrode 606 can be configured by the control circuit 404 for use as an anode or a cathode. For example, the central electrode 604 can be coupled to the control circuit 404 using a first lead 608 and the ring electrode 606 can be coupled to the control circuit 404 using a different second lead 610, and each lead can receive a different drive signal or different portion of a drive signal from the control circuit 404.

In an example, the ring electrode 606 and the central electrode 604 can be driven using respective portions of an AC excitation signal. That is, one of the ring electrode 606 and the central electrode 604 can serve as a drive electrode and the other of the ring electrode 606 and the central electrode 604 can serve as a reference or ground electrode. In response to the AC excitation signal, a resulting electric field generally corresponds (in part) to that illustrated in the example of FIG. 5C extending between the left electrode 508 and adjacent right electrode 510.

In an example, the insulator 612 can provide a generally uniform or non-uniform spacing between the outer edges of the central electrode 604 and the inner edges of the ring electrode 606. In some examples, the insulator 612 can provide about a 1 to 2 mm gap between the electrodes. Increasing the gap distance can be helpful for generating larger electric fields at the expense of higher power consumption. Generally, the spacing can be selected as a compromise between limitations on power consumption and desired characteristics of the electric field to be generated.

The present inventors have further recognized that noise tolerance, ground fault avoidance, and resistance to external influences on a generated electric field can be other variables to consider in the design of the body presence sensor 302 and the electrodes used therein. For example, when the ring electrode 606 is used as a detection electrode and the central electrode 604 is used as a reference electrode, then the sensor sensitivity to noise and external influences can be minimized relative to other configurations that use the central electrode 604 as the detection electrode and the ring electrode 606 as the reference.

Furthermore, the system can have more resistance to ground faults when the generated electric field is more focused toward a confined interior space and lateral fields are minimized. Ground faults can include erroneous readings due to the body presence sensor 302 being positioned at or near physical ground (i.e., Earth) such as can have different permittivity or conductivity characteristics (e.g., for asphalt, concrete, dirt, metal, etc). Such ground substrates can, under some circumstances, change a sensitivity of the body presence sensor 302 to a body in the focused detection zone, or can cause the body presence sensor 302 to erroneously indicate the presence of a body.

Figure 7:
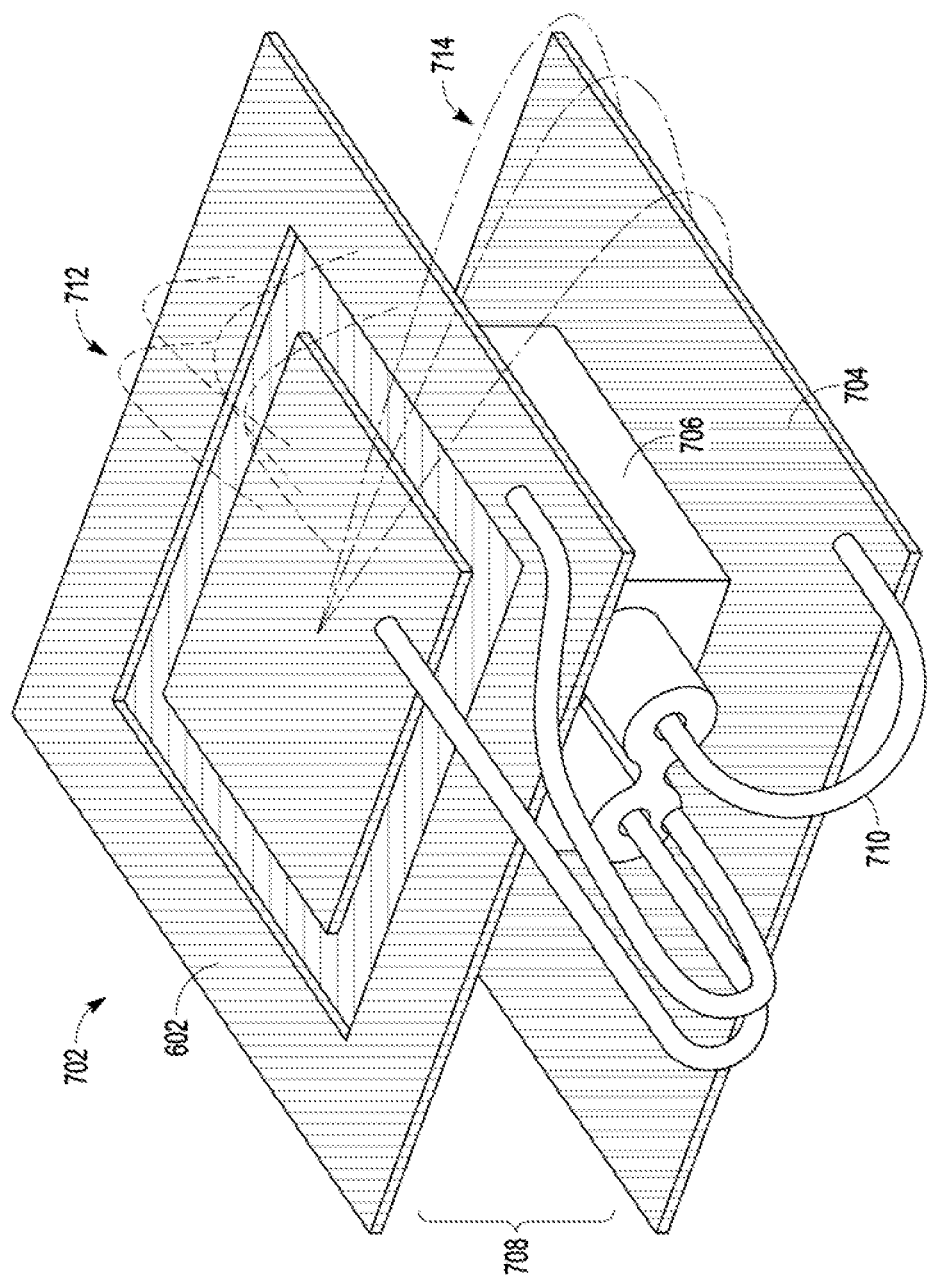
FIG. 7 illustrates generally an example of a second compound electrode assembly.

FIG. 7 illustrates generally an example of a second compound electrode assembly 702. The second compound electrode assembly 702 can include the first compound electrode assembly 602 from the example of FIG. 6 and at least one other electrode. For example, the second compound electrode assembly 702 can include a planar electrode 704 that can be provided near, but spaced apart from, the first compound electrode assembly 602. The planar electrode 704 can be coupled to excitation circuitry, such as comprising the control circuit 404, using a third lead 710.

In the example of FIG. 7, the second compound electrode assembly 702 includes the first compound electrode assembly 602 separated from the planar electrode 704 by an electrode spacing 708. The electrode spacing 708 can be an airgap or one or more intermediate components can be provided between the electrodes. For example, a circuitry housing 706 (e.g., comprising the housing 410) can be provided between the first compound electrode assembly 602 and the planar electrode 704. In an example, the circuitry housing 706 provides a fixed spacing between at least a portion of the planar electrode 704 and at least a portion of the first compound electrode assembly 602. In the example of FIG. 7, the circuitry housing 706 has a generally smaller outer perimeter than each of the adjacent electrode assemblies, however, other configurations or sizes of the housing can similarly be used. In other examples, the circuitry housing 706 is located elsewhere and a different insulating dielectric material can be interposed between the electrode assemblies.

In an example, the control circuit 404 can be configured to provide respective components of an AC drive signal to any pair of electrodes in the second compound electrode assembly 702. Each respective pair of driven electrodes can comprise a different sensor (sometimes referred to herein as a capacitive sensor or body presence sensor). For example, the control circuit 404 can provide respective components of a first AC drive signal to the ring electrode 606 and the central electrode 604, or can provide respective components of a second AC drive signal to the ring electrode 606 and the planar electrode 704, or can provide respective components of a third AC drive signal to the central electrode 604 and the planar electrode 704. The various AC signals can have different amplitude, frequency, duty cycle, or waveform morphology (shape) characteristics, such as can be selected according to an intended or desired characteristic of an electric field to be generated.

In an example, the control circuit 404 can be configured to electrically couple any two or more of the electrodes and use the coupled electrodes as a composite electrode. As used herein, a "composite electrode" refers to two or more discrete conductors or electrode features that are electrically coupled and driven together. For example, the ring electrode 606 and the central electrode 604 can be electrically coupled as a first composite electrode. The first composite electrode can receive a first portion of an AC signal from the control circuit 404 and the planar electrode 704 can receive a complementary second portion of the AC signal from the control circuit 404. Similarly, any one of the ring electrode 606 or central electrode 604 can be electrically coupled to and driven together with the planar electrode 704, and the other one of the ring electrode 606 and the central electrode 604 can be separately driven. Accordingly, multiple different electric fields can be generated in and around the second compound electrode assembly 702 depending on the particular electrode configuration used.

In the example of FIG. 7, the control circuit 404 can be configured to provide a first field 712 by driving the central electrode 604 and the ring electrode 606 of the first compound electrode assembly 602 using respective components of a first AC signal. The first field 712, and various characteristics of the first field 712 such as its direction and reach can be influenced by which of the ring electrode 606 and the central electrode 604 is selected as the anode and which is selected as the cathode.

The control circuit 404 can be further configured to provide a second field 714 by providing respective components of a second AC signal to the planar electrode 704 and to an electrically-coupled combination of the ring electrode 606 and central electrode 604. In an example, the first and second AC signals can be provided at different times or in a time-multiplexed manner, such as with or without a blanking period between the excitation intervals.

The present inventors have recognized that different combinations of electrodes used for excitation can have or exhibit different sensitivities to noise, to the influence of moisture or liquid, and to the presence or proximity of the body 402. For example, if the ring electrode 606 and the central electrode 604 are separately driven with respect to the planar electrode 704, then they exhibit different sensitivities to the proximity of the body 402 and different resistance or susceptibility to noise and liquid.

In some examples, capacitance-based foot sensing techniques can be relatively invariant to perspiration, or wetness generally, on the insole or in a sock around a foot. The effect of such moisture can be to reduce a dynamic range of the detection since the presence of moisture can increase a measured capacitance. However, in some examples, the dynamic range is sufficient to accommodate this effect within expected levels of moisture in footwear.

The present inventors have recognized that a body presence sensor 302, such as one that includes or uses multiple different electrode combinations to generate respective different electric fields, can be used to detect a presence of liquid or perspiration including in, but not limited to, an article of footwear. For example, when any two of at least three different electrode combinations is used, signal drift (e.g., relative to a baseline or reference value) due to liquid saturation can be represented by a difference between the two signals, and the difference can be proportional to an amount of liquid present. In other words, the effect of liquid saturation can be isolated and removed, for example, from body presence detection using information about a difference between multiple electric field-indicating signals. Accordingly, the noise or signal corruption that is attributable to liquid presence can be identified and removed to improve the accuracy of a foot presence determination.

Referring again to the example of the second compound electrode assembly 702 in FIG. 7, the ring electrode 606 and the central electrode 604, when separately driven relative to the planar electrode 704, can have different sensitivities to, or different responses to, the presence and volume of a liquid at the sensor. Similarly, when the planar electrode 704 is driven relative to a combination of the ring electrode 606 and central electrode 604, the sensor can have another different sensitivity to a presence and volume of liquid.

Figure 8:
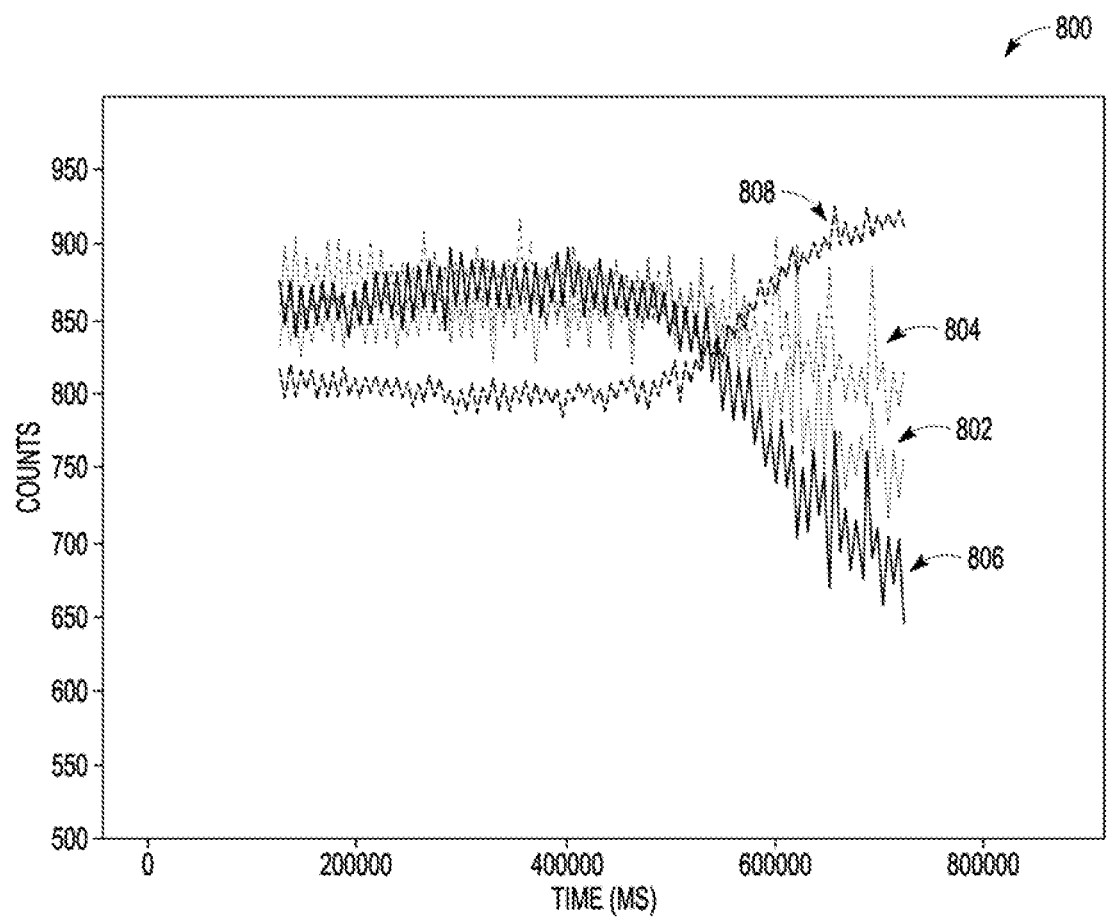
FIG. 8 illustrates generally an example of a chart showing capacitance-indicating signals over time for different electrode combinations in a capacitive sensor system.

FIG. 8 illustrates generally a first chart 800 showing capacitance-indicating signals (in units of "counts" as a surrogate for capacitance) over time for different electrode combinations in a body presence sensor that includes or uses the second compound electrode assembly 702. The first chart 800 represents a period during which liquid was incrementally introduced to an article of footwear (e.g., saline solution introduced at a rate of about 10 mL every minute) and the footwear includes the second compound electrode assembly 702. The responses of various different electrode combinations were measured at various time-multiplexed intervals to monitor the influence of the liquid.

In the example of the first chart 800, a first trace 802 represents a drift in the response of a capacitance-indicating signal from the central electrode 604 when it is driven relative to the planar electrode 704. A second trace 804 represents a drift in the response of a capacitance-indicating signal from the ring electrode 606 when it is driven relative to the planar electrode 704. A combination trace 806 represents a drift in the response of a capacitance-indicating signal from an electrically coupled pair of the ring electrode 606 and the central electrode 604 when the pair is driven relative to the planar electrode 704. A difference signal 808 represents a difference between the second trace 804 and the combination trace 806.

In the example of FIG. 8, as more liquid is added and saturation is increased, a magnitude of the difference signal 808 increases and is proportional to the amount of liquid present. In other words, information about a liquid saturation level in or around the body presence sensor 302 can be measured using magnitude information measured from multiple different electrode pairs. The liquid saturation level information can then be used, for example, to correct or calibrate response information from any one or more of the electrode pairs, for example, by indicating a need to introduce an offset or correction factor to mitigate the effect of any present liquid.

Figure 9:
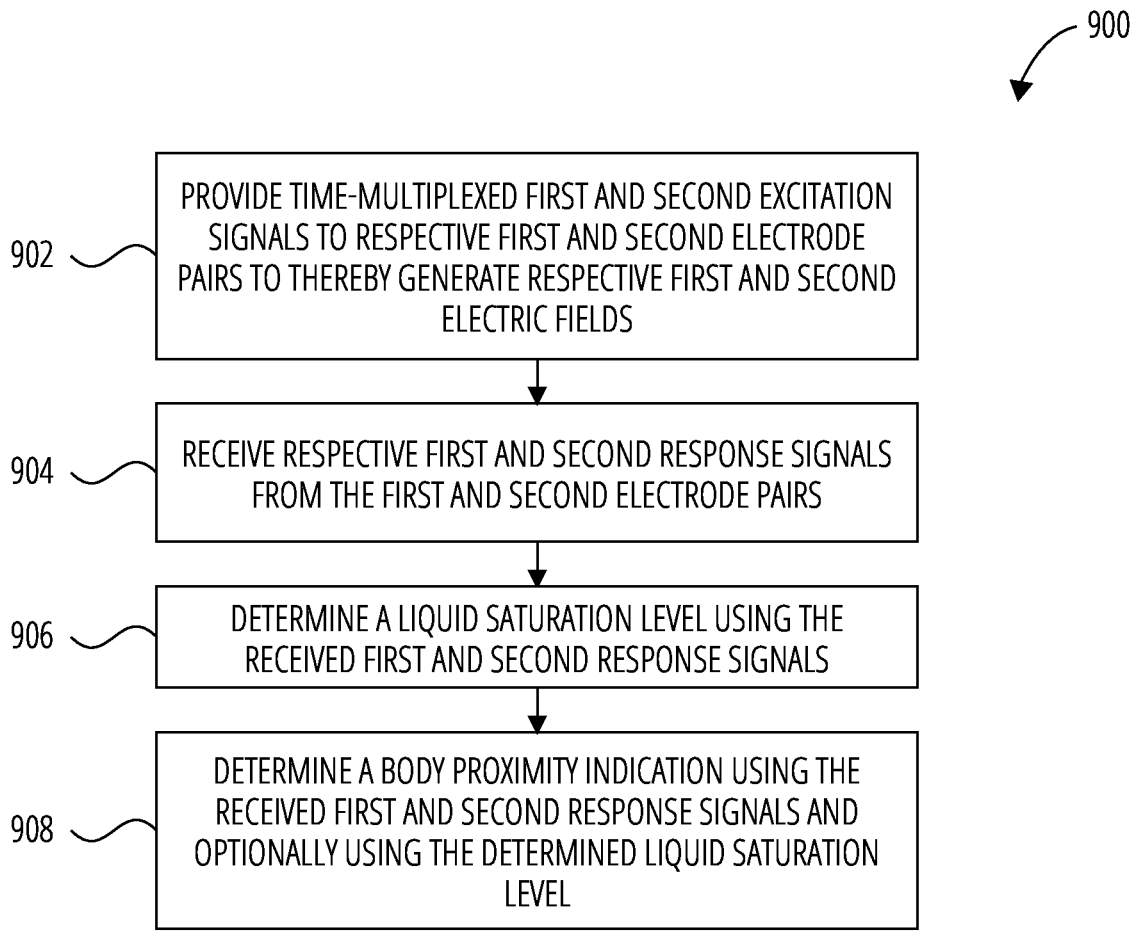
FIG. 9 illustrates generally an example of a method that can include determining a body proximity indication using a body presence sensor.

FIG. 9 illustrates generally an example of a first method 900 that can include determining a body proximity indication using information from a body presence sensor 302, and the body presence sensor 302 can include or use at least three different electrodes. For example, the body presence sensor 302 can include or use the second compound electrode assembly 702.

At block 902, the first method 900 can include providing time-multiplexed first and second excitation signals to respective first and second electrode pairs to thereby generate respective first and second electric fields. For example, block 902 can include using an excitation circuit to generate a first AC signal, and the components of the first AC signal can be provided to respective electrodes in the body presence sensor 302. In an example, at least one of the electrodes in the body presence sensor 302 is or includes a combination of two or more electrodes, such as the ring electrode 606 and the central electrode 604 of the first compound electrode assembly 602. Block 902 can further include using the excitation circuit to generate a second AC signal, and the components of the second AC signal can be provided to respective other electrodes in the body presence sensor 302. In response to the first and second AC signals, corresponding first and second electric fields can be generated, for example, in or near a foot-receiving cavity in an article of footwear.

In an example, block 902 can include providing the first and second excitation signals to the respective different electrode pairs at different times. The different times can include non-overlapping excitation intervals. In an example, a blanking period or an interval without an excitation signal can be interposed between the excitation signals. The first and second excitation signals can be delivered in a repeating sequence, for example, over a longer period of time. That is, the first excitation signal and the second excitation signal can be intermittently provided at different respective times. Each excitation interval can be, e.g., a few milliseconds or longer in duration.

At block 904, the first method 900 can include receiving first and second response signals from the first and second electrode pairs of the body presence sensor 302. For example, the control circuit 404 can be configured to receive information from each of the electrode pairs about any interruption detected in the electric field. The interruption can, for example, indicate a presence, absence, or changing position of a body at or near the body presence sensor 302. In an example, block 904 can include receiving a capacitance-indicating signal representative of a change in a capacitance measured by the electrode pairs.

At block 906, the first method 900 can include determining a liquid saturation level in an article that comprises the body presence sensor 302. Block 906 can include using the response signals received at block 904 to determine the liquid saturation level. For example, block 906 can include or use the control circuit 404 to measure first and second response signals, and determine a difference between the two response signals. The magnitude of the difference can be proportional to the liquid saturation level in the article.

At block 908, the first method 900 can include determining a body proximity indication relative to the body presence sensor 302. For example, block 908 can include using the response signals received at block 904, and optionally using information about the liquid saturation level from block 906, to determine whether a body is or is likely to be near the body presence sensor 302.

In an example, block 908 can include determining the body proximity indication using a comparison of one or more of the response signals (e.g., from block 904) or a portion thereof to a specified threshold value. In an example, block 908 can include or use information about a morphology characteristic of one of the response signals to determine the body proximity indication. In an example, the body proximity indication can include binary information about a presence or absence of the body (e.g., of a foot inside of footwear) or can include relative information about whether a body is fully or partially present. For example, the body proximity indication can include information about whether a footwear donning or doffing event is taking place (i.e., if a foot is present but is not seated in or adjacent to the footbed of an article of footwear). In an example, block 908 can include or use information about the liquid saturation level from block 906 to adjust a value or characteristic of, e.g., a threshold or morphology characteristic used to determine the body proximity indication.

Figure 10:
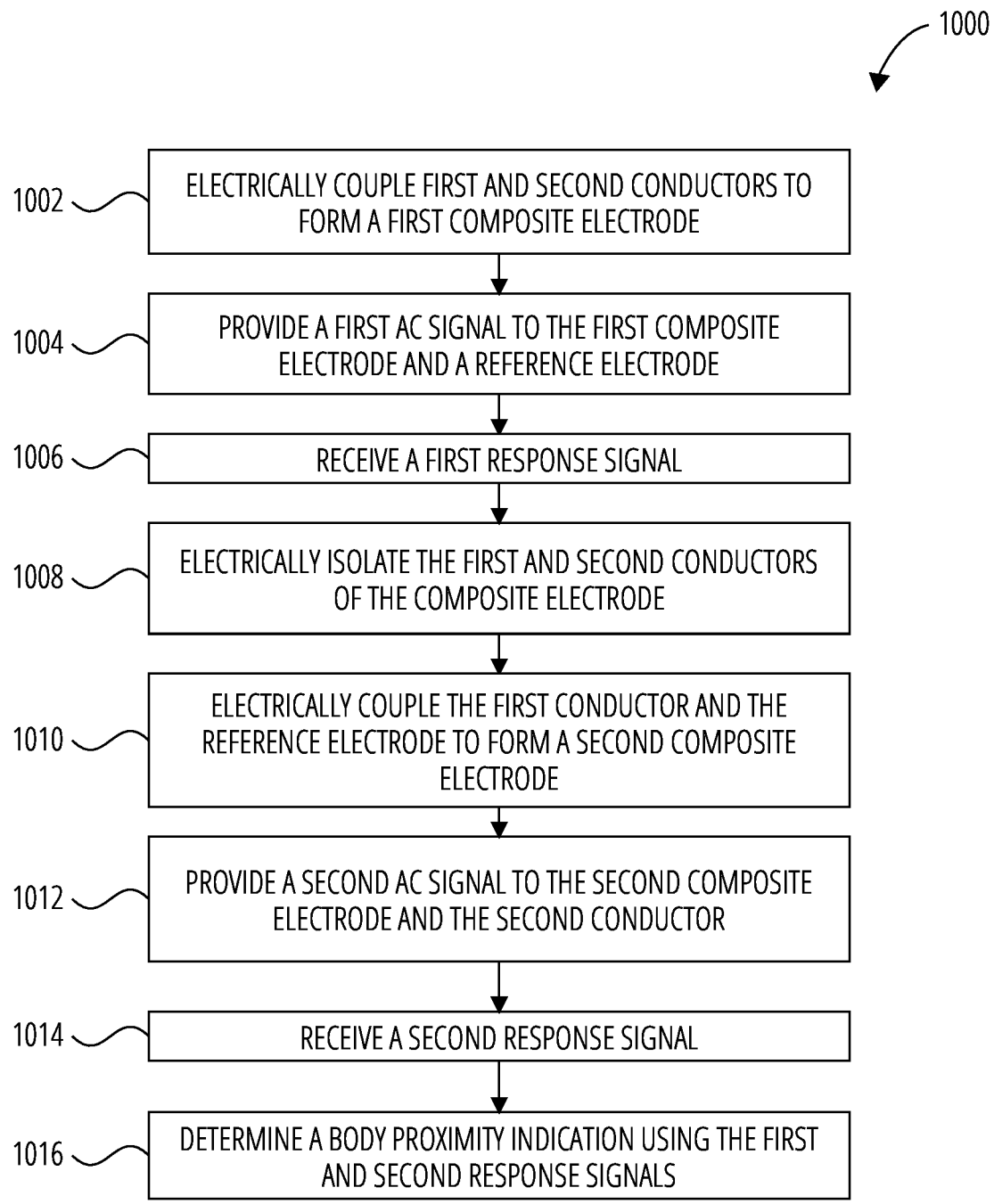
FIG. 10 illustrates generally an example of a method that can include using a compound electrode assembly to provide a body proximity indication.

FIG. 10 illustrates generally an example of a second method 1000 that can include using the second compound electrode assembly 702 from FIG. 7 to provide a body proximity indication. In the example of FIG. 10, the second compound electrode assembly 702 can comprise a portion of the body presence sensor 302 in an article of footwear and can be used to determine a presence or absence of a foot in the footwear.

At block 1002, the second method 1000 can include electrically coupling first and second conductors, or electrodes, to form a first composite electrode. For example, block 1002 can include electrically coupling the ring electrode 606 and the central electrode 604 of the first compound electrode assembly 602 so that the ring and central electrodes can be electrically driven together. At block 1004, the second method 1000 can include providing a first AC signal to the first composite electrode. For example, block 1004 can include providing respective components of the first AC signal to the planar electrode 704 and to the first composite electrode.

At block 1006, the second method 1000 can include receiving a first response signal in response to the first AC signal. The first response signal can include information about a first electric field, or about a change in a first electric field. The first electric field can be a field that is generated using the first composite electrode when it is excited by the first AC signal.

At block 1008, the second method 1000 can include electrically isolating the first and second conductors of the composite electrode. For example, block 1008 can include electrically decoupling the ring electrode 606 from the central electrode 604. When the electrodes are decoupled, they can be separately and independently driven.

At block 1010, the second method 1000 can include electrically coupling the first conductor and the reference electrode to form a second composite electrode. In an example, block 1010 can include electrically coupling the central electrode 604 to the planar electrode 704 so that the central and planar electrodes can be electrically driven together. At block 1012, the second method 1000 can include providing a second AC signal to the second composite electrode. For example, block 1012 can include providing respective components of the second AC signal to the ring electrode 606 and to the second composite electrode. In an example, the first and second AC signals are the same, and in other examples, the first and second AC signals can have different signal characteristics.

At block 1014, the second method 1000 can include receiving a second response signal in response to the second AC signal. The second response signal can include information about a second electrical field, or about a change in the second electric field. The second electric field can be a field that is generated using the second composite electrode when it is excited by the second AC signal.

At block 1016, the second method 1000 can include determining a body proximity indication using the first response signal received at block 1006 and using the second response signal received at block 1014. In an example, block 1016 can include combining (e.g., by summing or differencing) the first and second response signals to determine a signal of interest, and the signal of interest can be used to determine a body proximity indication, for example, by comparison with a specified reference threshold or reference condition.

The present inventors have further recognized that a problem to be solved includes determining when or whether to update threshold conditions that can be used to detect a presence or absence of a body at or near the body presence sensor 302. The inventors have recognized that the solution can include or use an algorithm that dynamically or continuously updates threshold conditions to track the changing real-world conditions in which the body presence sensor 302 is used. In an example, the solution can include or use a recursive filter, such as a Kalman filter, to help ensure smooth and predictable operation and resist noisy input signals.

For example, events such as "don" events and "doff" events, or state information such as "shoe on" and "shoe off" classifications, can be identified using the algorithm to estimate, filter, and track a body position-indicating signal, such as can be received from the body presence sensor 302. The algorithm can compare the filtered estimate to various thresholds to determine whether an event occurred and if a particular state, or state change, is indicated. In an example, the body position-indicating signal represents relative change, and the sensor itself can be susceptible to external influences or noise. Therefore, the thresholds can be updated dynamically to ensure proper operation as use conditions change.

In an example, the algorithm includes sampling the body position-indicating signal from the body presence sensor 302. Following each sample acquisition, a future sample value can be estimated, for example, using a recursive estimation filter such as a Kalman filter. Then, a subsequent actual sample can be measured, and a difference between the estimated future sample value and the actual sample value can be determined. The difference can be considered an error signal. The error signal can be used to update future predicted values, and so on.

Since noise is inherent to the sensor system, the measured values of the body position-indicating signal are generally not assumed to be exactly or absolutely correct. Instead, the updated prediction, or future predicted values, can be a weighted combination of a previous prediction and a measured value that, over time, helps reduce errors and provides a reasonable approximation of the body presence information to be sensed by the sensor.

Figure 11:
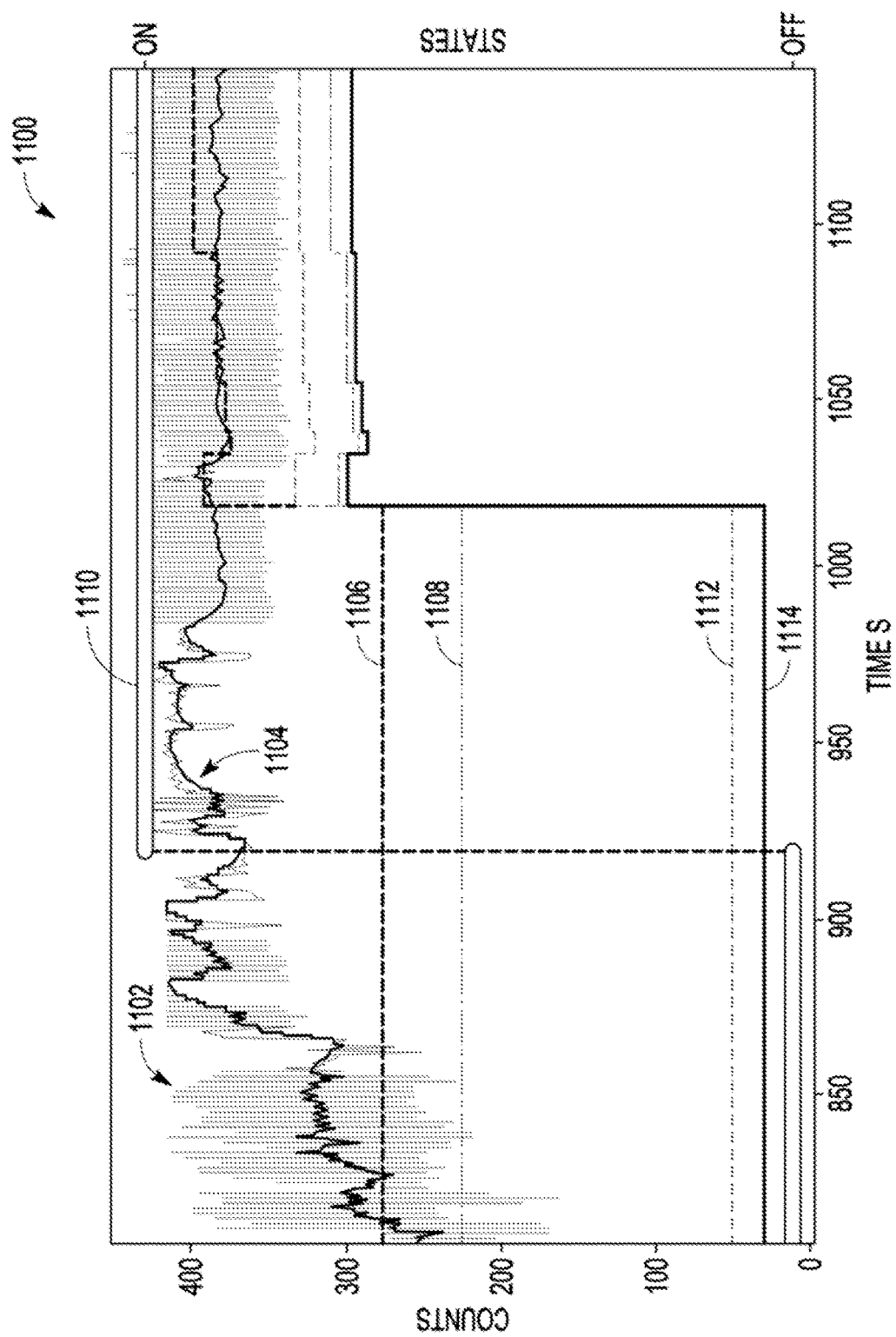
FIG. 11 illustrates generally an example of a chart showing a body position-indicating signal relative to various thresholds that can be dynamically changed.

FIG. 11 illustrates generally an example of a second chart 1100 that includes information about dynamic threshold updates, a body position-indicating signal, and a prediction signal. For example, the second chart 1100 includes a raw signal 1102 corresponding to an output from the body presence sensor 302 and indicating a position or proximity of a body (e.g., a foot) relative to a sensor. The second chart 1100 includes a prediction signal 1104 that corresponds to an output of a recursive filter that receives the raw signal 1102 as an input. In an example, the prediction signal 1104 represents an output or calculated signal that is based on a low-pass filtered version of the raw signal 1102. The prediction signal 1104 can represent an estimation of a joint probability distribution over a particular timeframe for values measured by the body presence sensor 302. In other words, the prediction signal 1104 can represent a result of processing multiple measurements from the body presence sensor 302 (e.g., from a sequential time series of measurements), including noise, to produce an estimated or predicted output.

In an example, the prediction signal 1104 can comprise an output of a Kalman filter, or an output of a function that includes or uses a Kalman filter or similar recursive filter or algorithm. The filter can receive the raw signal 1102 and provide an estimated future value. When the actual future value is measured, then the variables that provide further estimated future values can be updated based on the error between the original estimated future value and the actual future value. In an example, the estimated future value(s) can be calculated using a weighted average that favors more accurate outcomes. In an example, the filter can operate in real-time using information about current sensor output values and a previously-calculated estimated value. Various techniques can be used to optimize or enhance the accuracy of the filter or to tailor the filter to work best in a particular environment, such as for a body sensor inside of footwear.

The second chart 1100 further includes various thresholds that can be used, together with the prediction signal 1104, to determine various state information about the body or the body relative to the body presence sensor 302 or relative to an article that comprises the body presence sensor 302. For example, when the body presence sensor 302 is implemented inside of footwear and configured to detect a foot, the thresholds can be used with the prediction signal 1104 to determine whether the footwear is on or off of a foot, and if the footwear is on a foot, then the thresholds can be used to determine whether the user is in a particular posture, such as sitting or standing. Any one or more of the thresholds can be updated or changed dynamically or on-the-fly to accommodate different users such as can have different anatomy, different gait, or can be in different environments.

The example of the second chart 1100 includes an on threshold 1112 and an off threshold 1114. A value of the prediction signal 1104 can be compared with the on threshold 1112 to determine whether the foot is, or is likely to be, inside of the footwear. A value of the prediction signal 1104 can be compared with the off threshold 1114 to determine whether the foot is, or is likely to be, removed from or outside of the footwear. For example, if a value of the prediction signal 1104 exceeds the on threshold 1112, then the footwear can be considered to be occupied by a foot (i.e., state 1110=on). If, following a determination that the footwear is occupied, a value of the prediction signal 1104 falls below the off threshold 1114, then the footwear can be considered to be unoccupied by a foot (i.e., state 1110=off). In an example, information from one or more other sensors (e.g., the motion sensor 324, such as an accelerometer) can be used together with the threshold comparison of the prediction signal 1104 to validate or improve a confidence in the state determination. For example, the footwear can be considered to be occupied by a foot when the prediction signal 1104 exceeds the on threshold 1112 and when an accelerometer indicates movement of the footwear.

The example of the second chart 1100 includes a loaded threshold 1106 and an unloaded threshold 1108. A value of the prediction signal 1104 can be compared with the loaded threshold 1106 to determine whether the user is standing or "loading" the sensor. A value of the prediction signal 1104 can be compared with the unloaded threshold 1108 to determine whether the user is sitting or that the sensor is "unloaded" by the user.

Figure 12:
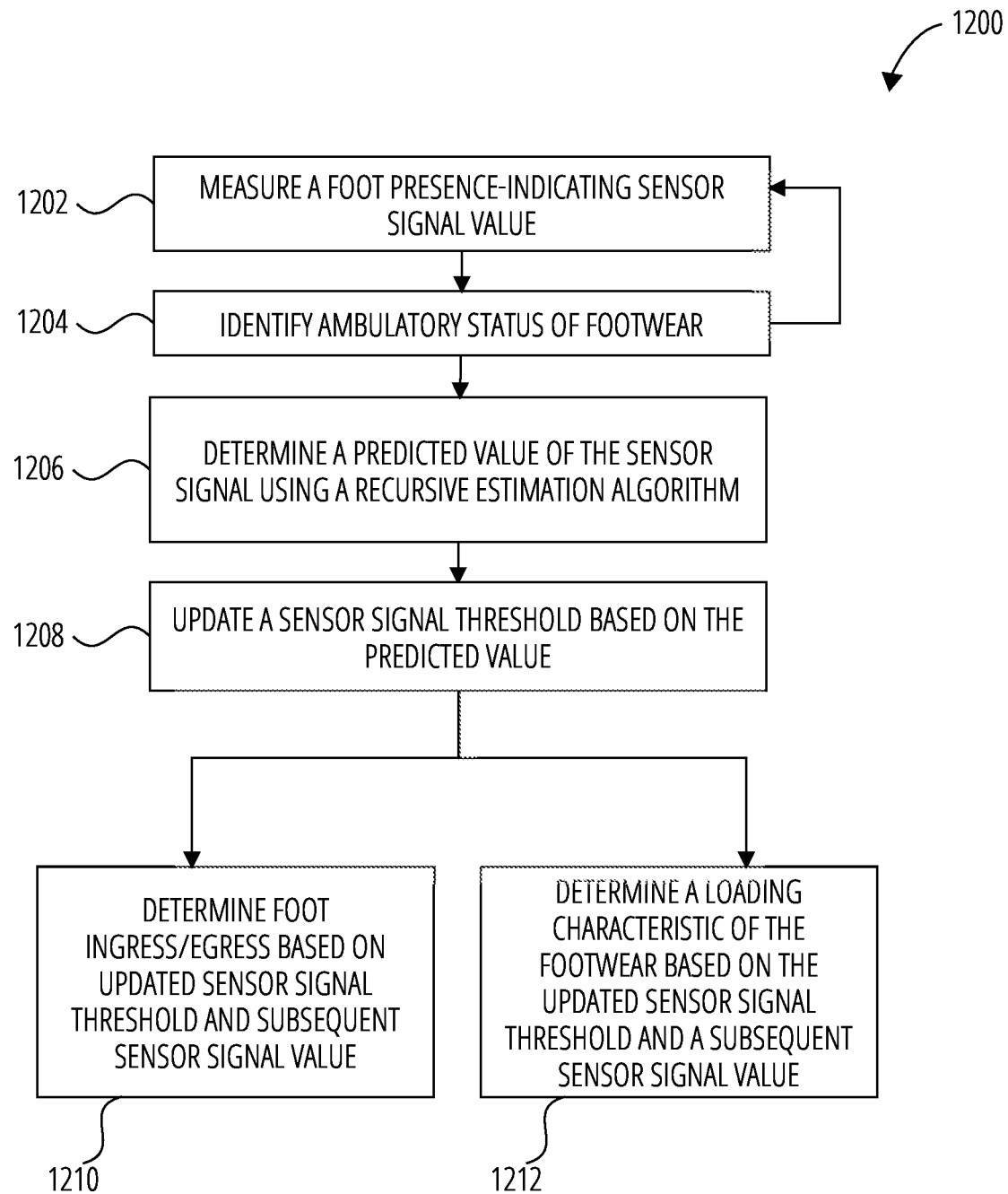
FIG. 12 illustrates generally an example of a method that can include determining a footwear use characteristic based on a body position-indicating sensor signal.

FIG. 12 illustrates generally an example of a third method 1200 that can include or use information about a body position-indicating sensor signal from the body presence sensor 302 to determine a footwear use characteristic for an article of active footwear. At block 1202, the third method 1200 can include measuring a foot presence-indicating sensor signal value. For example, block 1202 can include measuring a signal value from the body presence sensor 302, and the measured value can indicate an interruption or change in an electric field generated by the body presence sensor 302.

At block 1204, the third method 1200 can include identifying an ambulatory status of the footwear. For example, block 1204 can include receiving information about motion of the footwear from the motion sensor 324, such as can include an accelerometer, or information from the body presence sensor 302. In an example, block 1204 can include receiving motion information and processing the information to identify whether the signal includes or indicates a periodic signal that can correspond to walking or running. In an example, block 1204 can include processing the motion information to identify a footwear movement signal that indicates the footwear is, or is likely to be, undergoing a donning or doffing event. That is, the processing can compare the measured motion information to a motion profile or template to determine whether the footwear motion corresponds to a motion that is consistent with a user putting on or taking off the footwear. For example, a portion of the spectral content (e.g., frequency and energy information) from the sensor signal can be compared to, e.g., a template or to other spectral content from the same signal, to discern the ambulatory status. In an example, a machine learning algorithm can be applied to analyze the motion information (e.g., from one or more of the motion sensor 324 or the body presence sensor 302 or other sensor such as can be in communication with the active footwear) to provide the ambulatory status information, such as to discriminate between walking, running, or other use cadences or patterns or non-use. In an example, if no movement or ambulation of the footwear is identified at block 1204, then the third method 1200 can indicate a stationary status of the footwear and the method can return to block 1202 without proceeding to block 1206.

At block 1206, the third method 1200 can include determining a predicted, subsequent value of the foot presence-indicating sensor signal value. Block 1206 can include using a processor (such as the processor circuit 320) to receive the sensor signal from the body presence sensor 302 and, based on a present value of the sensor signal, use an algorithm to predict a next or later value of the sensor signal. In an example, block 1206 can include or use an estimation filter, such as a recursive estimation filter or other filter, that finds coefficients to minimize a cost function related to an input signal and can be used to provide an output that represents a prediction of a subsequent value of the input signal.

At block 1208, the third method 1200 can include updating a sensor signal threshold based on the predicted, subsequent value of the sensor signal. For example, block 1208 can include updating one or more of the on threshold 1112, the off threshold 1114, the loaded threshold 1106, or the unloaded threshold 1108, such as can be used to determine state information about the footwear or about a user of the footwear.

In an example, the third method 1200 can proceed from block 1208 to block 1210 and/or to block 1212. At block 1210, the third method 1200 can include determining a foot ingress to the footwear (i.e., donning event) or foot egress from the footwear (i.e., doffing event) based on a comparison of a present value of the sensor signal with an updated on or off threshold from block 1208. At block 1212, the third method 1200 can include determining a loading characteristic of the footwear based on a comparison of a present value of the sensor signal with an uploaded loading threshold from block 1208. For example, block 1212 can include determining whether a user is or is likely to be standing or sitting while wearing the footwear.

Figure 13:
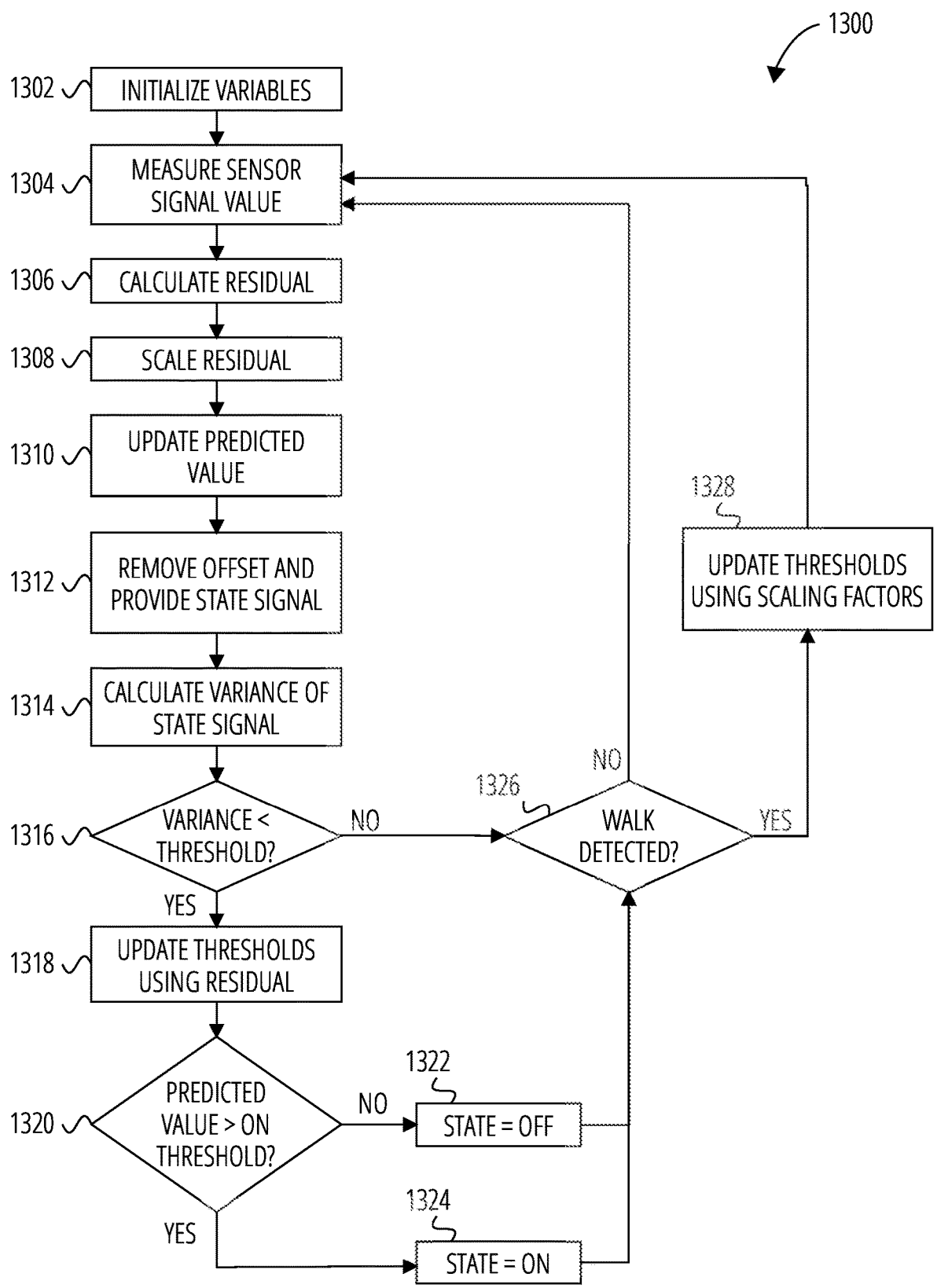
FIG. 13 illustrates generally an example of a method that can include changing one or more thresholds for determining a footwear status or footwear use characteristic.

FIG. 13 illustrates generally an example of a fourth method 1300 that can include or use information about a body position-indicating sensor signal from the body presence sensor 302 to change a threshold value or determine a footwear status or footwear use characteristic. Initial threshold values can be set or determined, for example, based on historical data or based on data from a population of body presence sensor 302 users. During use, sensor signal delta information from the body presence sensor 302 can be received and processed using the recursive filter to make predictions about future values of the sensor signal. One or more thresholds, such as can be used to indicate a state or a state change, can be updated or changed to accommodate each user or user environment.

The fourth method 1300 can begin at block 1302 with initializing variables. For example, block 1302 can include initializing a predicted value of the sensor signal from the body presence sensor 302 to an initial value (e.g., zero). Block 1302 can include initializing threshold values, such as the on threshold 1112, the off threshold 1114, the loaded threshold 1106, or the unloaded threshold 1108, to respective baseline values, such as can be based on prior data from the same user or same footwear, or can be based on population data or other historical data. In an example, block 1302 can include initializing one or more scaling factors that can be used throughout the fourth method 1300 as further explained below. In an example, the initial values of the predicted sensor signal and threshold conditions can be optimized to minimize false triggers or false indications of foot presence in or absence from the footwear.

At block 1304, the fourth method 1300 includes measuring a signal value from the body presence sensor 302. For example, block 1304 can include measuring a raw or unfiltered value from the body presence sensor 302. The measured value can indicate a capacitance or a change in an electric field generated by the body presence sensor 302 inside of footwear in a region that can be influenced by a presence or absence of a body or foot.

At block 1306, a residual value can be calculated based on the measured signal value from block 1304 and a predicted value of the sensor signal. In an example, the residual value can be based on a difference between the predicted value and the measured actual value of the sensor signal from the body presence sensor 302. The predicted value can be the initial value (e.g., zero) at first, but can be updated or changed using an estimation filter as described elsewhere herein.

At block 1308, the residual value from block 1306 can be scaled according to a scaling factor. The scaling factor can be a specified scalar value that is selected based on, e.g., historical data, population data, or other data, to optimize the fourth method 1300 and enhance accuracy of the algorithm. In an example, the scaling factor can be initialized at block 1302 and can be periodically updated, or can be a static value.

At block 1310, the fourth method 1300 can include updating the predicted value of the sensor signal to provide an updated prediction value. In an example, the updated prediction value can be a function of the residual value or the scaled residual value and an earlier or previous predicted value. For example, the updated prediction value can be a sum of the previous predicted value and the scaled residual from block 1308.

At block 1312, the fourth method 1300 can further process the sensor signal using the updated prediction value to provide a state signal. For example, a value of the state signal can correspond to a difference between a present measured value of the sensor signal (e.g., from block 1304) and the updated prediction value from block 1310. At block 1314, the fourth method 1300 can include determining a variance of the state signal. That is, block 1314 can include quantifying a deviation of the state signal from its mean or other expected value.

At decision block 1316, the fourth method 1300 can include comparing the determined variance from block 1314 to a variance threshold. The variance threshold can optionally be one of the variables initialized at block 1302, and can be a static or dynamic threshold. At decision block 1316, if the determined variance is relatively low or is less than the variance threshold, then the fourth method 1300 can proceed to decision block 1326. If the determined variance is relative high or is greater than the variance threshold, then the fourth method 1300 can proceed to block 1318.

At block 1318, the fourth method 1300 can include updating various thresholds according to prior threshold values and the magnitude of the determined variance from block 1314. For example, at block 1318, the shoe on threshold 1112 or shoe off threshold 1114 can be updated according to a sum of the prior corresponding threshold value and the scaled residual from block 1308 (e.g., an updated on threshold 1112 can be a sum of the prior on threshold 1112 and the scaled residual, or an updated off threshold 1114 can be a sum of the prior off threshold 1114 and the scaled residual). Similarly, the shoe loaded threshold 1106 or the shoe unloaded threshold 1108 can be updated according a sum of the prior corresponding threshold value and the scaled residual from block 1308 (e.g., an updated loaded threshold 1106 can be a sum of the prior loaded threshold 1106 and the scaled residual, or an updated unloaded threshold 1108 can be a sum of the prior unloaded threshold 1108 and the scaled residual).

Following the threshold updates at block 1318, the fourth method 1300 can include decision block 1320 to determine a state of the footwear that includes the body presence sensor 302. For example, at decision block 1320, if the updated prediction value of the sensor signal (e.g., as determined at block 1310) is greater than the updated on threshold 1112, then the footwear can be considered to occupied or on a foot. In contrast, if the updated prediction value of the sensor signal (e.g., as determined at block 1310) is less than the updated on threshold 1112, then the footwear can be considered to be unoccupied or off of a foot. Following the state determination, the fourth method 1300 can proceed to decision block 1326.

At decision block 1326, the fourth method 1300 can include determining whether a walk or step event is detected. A step event can be detected in various ways, including using information from the motion sensor 324 or using information about a periodicity or other characteristic of the sensor signal from the body presence sensor 302, or from a different sensor. In an example, the periodicity can correspond generally to foot fall or foot lift (or footwear fall, or footwear lift) events that are evident in changes in a magnitude or frequency of the sensor signal(s). If a walk or step event is not detected at decision block 1326, then the fourth method 1300 can return to block 1304 without other updates to thresholds or scaling factors. If a walk or step event is detected at decision block 1326, then the fourth method 1300 can proceed to block 1328.

At block 1328, one or more thresholds or scaling factors can be updated for use in further analysis of the footwear status. For example, at block 1328, the on threshold 1112 or the off threshold 1114 can be updated according to a prior value of the corresponding threshold and a specified scaling factor. For example, the on threshold 1112 can be updated according to a minimum value (e.g., a local minimum) of the sensor signal (or of the predicted signal) scaled according to a first scaling factor. The off threshold 1114 can be updated according to the same minimum value of the sensor signal scaled according to the same first scaling factor or a different scaling factor. In an example, the unloaded threshold 1108 can be similarly updated according to a maximum value (e.g., a local maximum) of the sensor signal (or of the predicted signal) scaled according to a second scaling factor. The loaded threshold 1106 can be similarly updated according to the same maximum value of the sensor signal (or of the predicted signal) scaled according to a third scaling factor. In an example, a value of the second scaling factor can be less than a value of the third scaling factor. Any one or more of the scaling factors can be specific to a user, to a particular article of footwear, to a particular use condition or environment, or can be a global scaling factor. Following block 1328, the fourth method 1300 can proceed to block 1304 and the updated thresholds can be used for subsequent footwear status determinations. The fourth method 1300 can operate as a loop to continuously and dynamically update the thresholds used for footwear state or status determinations.

Figure 14:
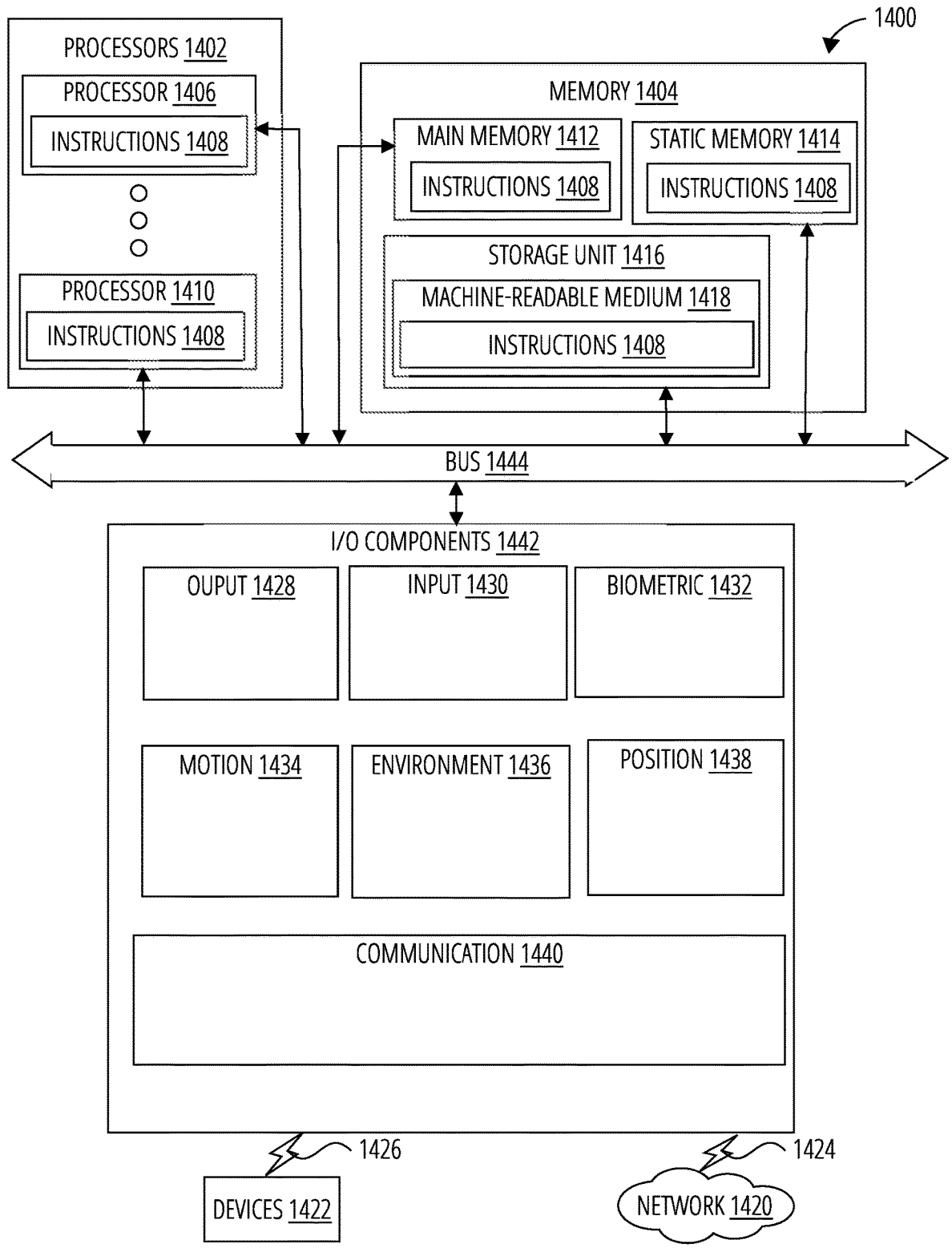
FIG. 14 is a block diagram illustrating an example computing device capable of performing aspects of the various techniques discussed herein.

FIG. 14 is a diagrammatic representation of a machine 1400 within which instructions 1408 (e.g., software, a program, an application, an applet, an app, or other executable code) for causing the machine 1400 to perform any one or more of the methodologies discussed herein may be executed. For example, the instructions 1408 may cause the machine 1400 to execute any one or more of the methods described herein, such as to control a footwear system using or in response to information from a body presence-indicating sensor. The instructions 1408 transform the general, non-programmed machine 1400 into a particular machine 1400 programmed to carry out the described and illustrated functions in the manner described. The machine 1400 may operate as a standalone device or may be coupled (e.g., networked) to other machines, such as to coordinate actions or actuation of multiple different shoes or footwear systems. In a networked deployment, the machine 1400 may operate in the capacity of a server machine or a client machine in a server-client network environment, or as a peer machine in a peer-to-peer (or distributed) network environment. The machine 1400 may comprise, but not be limited to, a server computer, a client computer, a personal computer (PC), a tablet computer, a laptop computer, a netbook, a set-top box (STB), a PDA, an entertainment media system, a cellular telephone, a smart phone, a mobile device, a wearable device (e.g., a smart watch), a smart home device (e.g., a smart appliance), other smart devices, a web appliance, a network router, a network switch, a network bridge, or any machine capable of executing the instructions 1408, sequentially or otherwise, that specify actions to be taken by the machine 1400. Further, while only a single machine 1400 is illustrated, the term "machine" shall also be taken to include a collection of machines that individually or jointly execute the instructions 1408 to perform any one or more of the methodologies discussed herein.

The machine 1400 may include processors 1402, memory 1404, and I/O components 1442, which may be configured to communicate with each other via a bus 1444. In an example embodiment, the processors 1402 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an ASIC, a Radio-Frequency Integrated Circuit (RFIC), another Processor, or any suitable combination thereof) may include, for example, a processor 1406 and a processor 1410 that execute the instructions 1408. The term "Processor" is intended to include multi-core processors that may comprise two or more independent processors (sometimes referred to as "cores") that may execute instructions contemporaneously. Although FIG. 14 shows multiple processors 1402, the machine 1400 may include a single processor with a single core, a single processor with multiple cores (e.g., a multi-core processor), multiple processors with a single core, multiple processors with multiples cores, or any combination thereof.

The memory 1404 includes a main memory 1412, a static memory 1414, and a storage unit 1416, both accessible to the Processors 1402 via the bus 1444. The main memory 1404, the static memory 1414, and storage unit 1416 store the instructions 1408 embodying any one or more of the methodologies or functions described herein. The instructions 1408 may also reside, completely or partially, within the main memory 1412, within the static memory 1414, within machine-readable medium 1418 within the storage unit 1416, within at least one of the processors 1402 (e.g., within the processor's cache memory), or any suitable combination thereof, during execution thereof by the machine 1400.

The I/O components 1442 may include a wide variety of components to receive input, provide output, produce output, transmit information, exchange information, capture measurements, and so on. The specific I/O components 1442 that are included in a particular machine will depend on the type of machine. For example, portable machines such as mobile phones may include a touch input device or other such input mechanisms, while a headless server machine will likely not include such a touch input device. It will be appreciated that the I/O components 1442 may include many other components that are not shown in FIG. 14. In various example embodiments, the I/O components 1442 may include output components 1428 and input components 1430. The output components 1428 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators such as the control circuit 404 or the processor circuit 320, and so forth. The input components 1430 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and/or force of touches or touch gestures, or other tactile input components), audio input components (e.g., a microphone), and the like.

In further example embodiments, the I/O components 1442 may include various sensors such as can comprise one or more of biometric components 1432, motion components 1434, environmental components 1436, or position components 1438, among a wide array of other components. For example, the biometric components 1432 include components to detect expressions (e.g., hand expressions, facial expressions, vocal expressions, body gestures, or eye tracking), measure biosignals (e.g., blood pressure, heart rate, body temperature, perspiration, muscle oxygenation, or brain waves), identify a person (e.g., voice identification, retinal identification, facial identification, fingerprint identification, or electroencephalogram-based identification), and the like. The motion components 1434 can include the motion sensor 324 such as can include acceleration sensor components (e.g., accelerometer), gravitation sensor components, rotation sensor components (e.g., gyroscope), and so forth. The environmental components 1436 include, for example, illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 1438 include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 1442 further include communication components 1440 operable to couple the machine 1400 to a network 1420 or devices 1422 via a coupling 1424 and a coupling 1426, respectively. For example, the communication components 1440 may include a network interface component or another suitable device to interface with the network 1420. In further examples, the communication components 1440 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 1422 may be another machine or any of a wide variety of peripheral devices (e.g., a peripheral device coupled via a USB).

Moreover, the communication components 1440 may detect identifiers or include components operable to detect identifiers. For example, the communication components 1440 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes and other optical codes), or acoustic detection components (e.g., microphones to identify tagged audio signals). In addition, a variety of information may be derived via the communication components 1440, such as location via Internet Protocol (IP) geolocation, location via Wi-Fi® signal triangulation, location via detecting an NFC beacon signal that may indicate a particular location, and so forth.

The various memories (e.g., memory 1404, main memory 1412, static memory 1414, and/or memory of the Processors 1402) and/or storage unit 1416 may store one or more sets of instructions and data structures (e.g., software) embodying or used by any one or more of the methodologies or functions described herein. These instructions (e.g., the instructions 1408), when executed by Processors 1402, cause various operations to implement the disclosed embodiments.

The instructions 1408 may be transmitted or received over the network 1420, using a transmission medium, via a network interface device (e.g., a network interface component included in the communication components 1440) and using any one of a number of well-known transfer protocols (e.g., hypertext transfer protocol (HTTP)). Similarly, the instructions 1408 may be transmitted or received using a transmission medium via the coupling 1426 (e.g., a peer-to-peer coupling) to the devices 1422.

Various Examples of the present disclosure can help provide a solution to the body presence sensing related problems identified herein. Example 1 can include a footwear sensor system comprising a first capacitive sensor comprising a first electrode pair in an article of footwear, the first capacitive sensor configured to use a first excitation signal to provide a first electric field at least partially inside the article of footwear, a second capacitive sensor comprising a second electrode pair in the article of footwear, the second capacitive sensor configured to use a second excitation signal to provide a second electric field at least partially inside the article of footwear, a signal generator configured to provide the first and second excitation signals, and a processor circuit configured to provide a foot presence indication based on information received from the first and second capacitive sensors about an interruption in the first and second electric fields.

In Example 2, the subject matter of Example 1 can include the first electrode pair comprising a ring electrode and a reference electrode.

In Example 3, the subject matter of Example 2 can include the ring electrode occupying a first plane, the reference electrode occupying a second plane, and the first and second planes are spaced apart by at least a fixed distance.

In Example 4, the subject matter of any one or more of Examples 2-3 can include the reference electrode with a conductor having a planar surface area that exceeds a surface area of the ring electrode.

In Example 5, the subject matter of any one or more of Examples 2-4 can include the second electrode pair comprising a planar electrode and the reference electrode.

In Example 6, the subject matter of Example 5 can include the planar electrode provided coaxially with the ring electrode, and the planar electrode and the ring electrode can be spaced apart.

In Example 7, the subject matter of any one or more of Examples 5-6 can include the planar electrode and the ring electrode sharing a substrate in a first plane (i.e., comprising a common substrate).

In Example 8, the subject matter of Example 7 can include the reference electrode occupying a second plane that can be spaced apart from the first plane.

In Example 9, the subject matter of any one or more of Examples 1-8 can include the first electrode pair including a first electrode and a reference electrode, the second electrode pair can include a second electrode and the reference electrode, and the signal generator can be configured to provide a third excitation signal between the first and second electrodes. In response, a third electric field can extend between the first and second electrodes and into a foot-receiving cavity of the article of footwear.

In Example 10, the subject matter of Example 9 includes the article of footwear, and the electrodes of the first and second capacitive sensors comprise respective planar electrode portions that are provided in parallel with a footbed of the article of footwear.

In Example 11, the subject matter of Example 10 includes a sensor housing configured to be disposed in an arch region or central region of the footbed of the article of footwear.

In Example 12, the subject matter of any one or more of Examples 1-11 can include the first and second excitation signals having respective different frequency characteristics.

In Example 13, the subject matter of any one or more of Examples 1-12 can include the first and second excitation signals having respective different amplitude characteristics.

In Example 14, the subject matter of any one or more of Examples 1-13 can include the signal generator configured to provide the first and second excitation signals in a time-multiplexed manner.

In Example 15, the subject matter of any one or more of Examples 1-14 can include the signal generator configured to provide the first and second excitation signals concurrently.

In Example 16, the subject matter of any one or more of Examples 1-15 can include the processor circuit configured to receive a first response signal from the first capacitive sensor in response to the first excitation signal and receive a second response signal from the second capacitive sensor in response to the second excitation signal, and the processor circuit can be configured to provide the foot presence indication based on a sum of the first and second response signals.

In Example 17, the subject matter of any one or more of Examples 1-16 can include the processor circuit configured to receive a first response signal from the first capacitive sensor in response to the first excitation signal and receive a second response signal from the second capacitive sensor in response to the second excitation signal, and the processor circuit can be configured to provide the foot presence indication based on a difference between the first and second response signals.

In Example 18, the subject matter of Example 17 can include the first electrode pair of the first capacitive sensor including a reference electrode and a composite electrode, and the composite electrode including coplanar and coaxial main and ring electrodes, and the second electrode pair of the second capacitive sensor can include the reference electrode and the ring electrode. In Example 18, the signal generator can be configured to provide the first excitation signal to the composite electrode during a first excitation interval, and provide the second excitation signal to the ring electrode during a second excitation interval, and the main electrode can be electrically de-coupled from the ring electrode during the second excitation interval.

In Example 19, the subject matter of any one or more of Examples 1-18 can include the processor circuit configured to determine a liquid saturation level of one or more portions of the article of the footwear based on the information received from the first and second capacitive sensors, and the processor circuit can be configured to use the determined liquid saturation level to provide the foot presence indication.

Example 20 is a footwear system comprising a first electrode, a second electrode, a third electrode, a signal generator configured to provide excitation signals to respective electrode groups of the first, second, and/or third electrodes at respective different times, and a processor circuit configured to receive electric field information from the respective electrode groups and, in response, determine whether a foot is present in or absent from a foot-receiving cavity of an article of footwear.

In Example 21, the subject matter of Example 20 can include a first electrode group including the first and second electrodes electrically coupled as an anode and the third electrode as a cathode, a second electrode group including the first electrode as an anode and the third electrode as a cathode and the second electrode can be electrically isolated from the first and third electrodes, and the signal generator can be configured to provide a first AC excitation signal to the first electrode group at a first time and provide a second AC excitation signal to the second electrode group at a different second time.

In Example 22, the subject matter of Example 21 can include the processor circuit configured to receive a first response signal from the first electrode group at the first time and receive a second response signal from the second electrode group at the second time, and the processor circuit can be configured to use information about a difference between the first and second response signals to determine a liquid saturation of a portion of the article of footwear.

In Example 23, the subject matter of Example 22 can include the processor circuit configured to determine whether the foot is present in or absent from the foot-receiving cavity of the article of footwear using the liquid saturation as-determined.

In Example 24, the subject matter of any one or more of Examples 20-23 can include the signal generator configured to provide a first AC excitation signal between the first and second electrodes at a first time, and the signal generator can be configured to provide a second AC excitation signal between the third electrode and a composite electrode that includes the first and second electrodes at a second time.

Example 25 is a method comprising providing time-multiplexed first and second excitation signals from a signal generator circuit to respective first and second electrode pairs in an article of footwear to thereby generate respective first and second electric fields in the article of footwear. Example 25 can further include receiving, at a processor circuit, respective first and second response signals from the first and second electrode pairs, and determining a foot proximity indication for a foot inside the article of footwear using the received first and second response signals (e.g., by processing the first and second response signals together such as by summing, differencing, or otherwise operating on the signals or information from the signals).

In Example 26, the subject matter of Example 25 can include providing the first excitation signal to the first electrode pair including providing a first AC signal between a reference electrode and electrically-coupled ring and main electrodes, and providing the second excitation signal to the second electrode pair can include providing a second AC signal between the reference electrode and the ring electrode.

In Example 27, the subject matter of Example 26 can include determining the foot proximity indication using information about a difference between the first and second response signals.

In Example 28, the subject matter of any one or more of Examples 25-27 includes determining a liquid saturation level of a portion of the article of footwear using the first and second response signals, and determining the foot proximity indication includes using the liquid saturation level as-determined.

In Example 29, the subject matter of any one or more of Examples 25-28 can include providing the first excitation signal including electrically coupling first and second conductor portions of a composite electrode, and providing the second excitation signal includes electrically isolating the first and second conductor portions of the composite electrode.

In Example 30, the subject matter of Example 29 can include providing the second excitation signal including electrically coupling the second conductor portion to a reference electrode.

Example 31 is a sensor signal processing method comprising sampling values of a sensor signal from a foot presence sensor in an article of footwear, identifying an ambulatory status of the article of footwear using the sampled values of the sensor signal, updating a sensor signal threshold in response to identifying the ambulatory status, and determining a foot ingress to, or egress from, the article of footwear based on the updated sensor signal threshold and a subsequent value of the sensor signal.

In Example 32, the subject matter of Example 31 can include identifying the ambulatory status including comparing one or more values of the sensor signal with a reference threshold value.

In Example 33, the subject matter of any one or more of Examples 31-32 can include identifying the ambulatory status including filtering the sensor signal using a low-pass filter to provide a filtered signal, and analyzing a series of values of the filtered signal to discern the ambulatory status of the article of footwear from a stationary status of the article of footwear.

In Example 34, the subject matter of any one or more of Examples 31-33 can include updating the sensor signal threshold including determining a predicted value of the sensor signal based on a prior value of the sensor signal. In Example 34, when the predicted value of the sensor signal meets or exceeds a reference threshold value, the example can include updating the sensor signal threshold to have a threshold value that is based in part on the predicted value of the sensor signal or on a present value of the sensor signal.

In Example 35, the subject matter of Example 34 can include the reference threshold value is based on a magnitude of a difference between the predicted value and the present value of the sensor signal.

In Example 36, the subject matter of any one or more of Examples 31-35 can include identifying the ambulatory status including identifying a periodicity of the sensor signal over time, the periodicity corresponding to footwear fall and footwear lift events (e.g., corresponding to one or more step events), and updating the sensor signal threshold can include using a magnitude characteristic of the sensor signal over time.

In Example 37, the subject matter of Example 36 can include updating the sensor signal threshold including using a minimum value characteristic of the sensor signal to determine a foot presence/absence threshold value, and determining the foot ingress to, or egress from, the article of footwear can include using the foot presence/absence threshold value.

In Example 38, the subject matter of any one or more of Examples 36-37 includes updating a footwear loading threshold using a maximum value characteristic of the sensor signal, and determining a footwear loading status for the article of footwear based on the footwear loading threshold and the subsequent value of the sensor signal.

In Example 39, the subject matter of any one or more of Examples 31-38 includes processing the sensor signal from the foot presence sensor using a recursive estimation filter to provide a predicted sensor value, and wherein determining the foot ingress to, or egress from, the article of footwear includes using the updated sensor signal threshold and using information about a difference between the predicted sensor value and the subsequent value of the sensor signal.

In Example 40, the subject matter of any one or more of Examples 31-39 can include sampling values of the sensor signal including sampling capacitance-indicating values of a sensor signal from a capacitance-based foot presence sensor.

Example 41 is a sensor signal processing method comprising sampling values of a sensor signal from a foot presence sensor in an article of footwear, identifying an ambulatory status of the article of footwear using the sampled values of the sensor signal, updating a sensor signal threshold in response to identifying the ambulatory status, and determining a loading characteristic of the article of footwear based on the updated sensor signal threshold and a subsequent value of the sensor signal.

In Example 42, the subject matter of Example 41 can include processing the sensor signal from the foot presence sensor using a recursive estimation filter to provide a predicted sensor value, identifying a variance between the predicted sensor value and a subsequent value of the sensor signal from the foot presence sensor, and identifying the ambulatory status of the article of footwear in response to the variance exceeding a specified variance threshold value.

In Example 43, the subject matter of Example 42 can include updating the sensor signal threshold including determining a maximum value characteristic of the sensor signal, and calculating an updated sensor signal threshold based on the maximum value characteristic and a specified scaling factor.

In Example 44, the subject matter of Example 43 includes determining a minimum value characteristic of the sensor signal, and calculating a foot presence threshold based on the minimum value characteristic and a second specified scaling factor.

In Example 45, the subject matter of any one or more of Examples 41-44 includes processing the sensor signal from the foot presence sensor using a recursive estimation filter to provide a predicted sensor value, identifying a variance between the predicted sensor value and a subsequent value of the sensor signal from the foot presence sensor, and updating the sensor signal threshold based on a prior threshold and the identified variance.

In Example 46, the subject matter of any one or more of Examples 41-45 can include determining the loading characteristic of the article of footwear including determining a foot is present inside the article of footwear and including determining whether the subsequent value of the sensor signal represents a standing or sitting posture for a wearer of the article of footwear.

In Example 47, the subject matter of any one or more of Examples 41-46 can include determining the loading characteristic of the article of footwear including determining a relative force amount applied by a foot to a footbed of the article of footwear.

In Example 48, the subject matter of any one or more of Examples 41-47 can include sampling values of the sensor signal including sampling capacitance-indicating values of a sensor signal from a capacitance-based foot presence sensor.

Example 49 is an article of footwear comprising a foot presence sensor comprising multiple electrodes configured to generate and detect changes in an electric field inside the article of footwear, wherein the changes indicate a presence or a position of a foot inside the article of footwear, and a processor circuit configured to receive a foot position-indicating signal from the foot presence sensor, process the signal using a recursive estimation algorithm to provide a predicted sensor value, compare the predicted sensor value to a subsequent value of the foot position-indicating signal from the foot presence sensor to provide a comparison result, and determine at least one of a foot presence, foot absence, or footwear loading characteristic for the article of footwear based on the comparison result.

In Example 50, the subject matter of Example 49 can include the foot presence sensor comprising the multiple electrodes are disposed in or on a footbed of the article of footwear.

In Example 51, the subject matter of Example 50 includes a dielectric member interposed between the foot presence sensor and a foot-receiving cavity of the article of footwear, the dielectric member having a permittivity that is greater than a permittivity of air.

In Example 52, the subject matter of any one or more of Examples 49-51 can include the processor circuit configured to change a foot presence/absence threshold or a footwear loading threshold based on a minimum or maximum magnitude characteristic of the foot position-indicating signal.

In Example 53, the subject matter of any one or more of Examples 49-52 can include the foot presence sensor including a capacitance-based foot presence sensor configured to provide the foot position-indicating signal with information corresponding to a changing capacitance as-measured by the foot presence sensor.

Example 54 is at least one machine-readable medium including instructions that, when executed by processing circuitry, cause the processing circuitry to perform operations to implement of any of Examples 1-53.

Example 55 is an apparatus comprising means to implement of any of Examples 1-53.

Example 56 is a system to implement of any of Examples 1-53.

Example 57 is a method to implement of any of Examples 1-53.

Each of these non-limiting Examples can stand on its own or can be combined in various permutations or combinations with one or more of the other Aspects, examples, or features discussed elsewhere herein.

The above description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof, either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A footwear sensor system comprising:
a first capacitive sensor comprising a first electrode pair in an article of footwear, the first capacitive sensor configured to use a first excitation signal to provide a first electric field at least partially inside the article of footwear, wherein the first electrode pair comprises a ring electrode and a reference electrode;
a second capacitive sensor comprising a second electrode pair in the article of footwear, the second capacitive sensor configured to use a second excitation signal to provide a second electric field at least partially inside the article of footwear, wherein the second electrode pair comprises a planar electrode and the reference electrode, and wherein the planar electrode is provided coaxially with the ring electrode, and wherein the planar electrode and the ring electrode are spaced apart;
a signal generator configured to provide the first and second excitation signals; and
a processor circuit configured to provide a foot presence indication based on information received from the first and second capacitive sensors about an interruption in the first and second electric fields.

2. The footwear sensor system of claim 1, wherein the processor circuit is configured to determine a liquid saturation level of one or more portions of the article of the footwear based on the information received from the first and second capacitive sensors, and wherein the processor circuit is configured to use the determined liquid saturation level to provide the foot presence indication.

3. The footwear sensor system of claim 1, wherein the ring electrode occupies a first plane, the reference electrode occupies a second plane, and the first and second planes are spaced apart by at least a fixed distance.

4. The footwear sensor system of claim 1, wherein the reference electrode comprises a conductor having a planar surface area that exceeds a surface area of the ring electrode.

5. The footwear sensor system of claim 1, wherein the processor circuit is configured to receive a first response signal from the first capacitive sensor in response to the first excitation signal and receive a second response signal from the second capacitive sensor in response to the second excitation signal; and
wherein the processor circuit is configured to provide the foot presence indication based on a sum of the first and second response signals.

6. The footwear sensor system of claim 1, wherein the planar electrode and the ring electrode share a substrate in a first plane, and wherein the reference electrode occupies a second plane that is spaced apart from the first plane.

7. The footwear sensor system of claim 1,
wherein the signal generator is configured to provide a third excitation signal between the ring and planar electrodes and, in response, a third electric field extends between the ring and planar electrodes and into a foot-receiving cavity of the article of footwear.

8. The footwear sensor system of claim 7, further comprising:
the article of footwear, wherein the electrodes of the first and second capacitive sensors comprise respective planar electrode portions that are provided in parallel with a footbed of the article of footwear; and
a sensor housing configured to be disposed in an arch region of the footbed of the article of footwear.

9. The footwear sensor system of claim 1, wherein the first and second excitation signals have respective different frequency characteristics and/or have respective different amplitude characteristics.

10. The footwear sensor system of claim 1, wherein the signal generator is configured to provide the first and second excitation signals in a time-multiplexed manner.

11. The footwear sensor system of claim 1, wherein the signal generator is configured to provide the first and second excitation signals concurrently.

12. The footwear sensor system of claim 1, wherein the processor circuit is configured to receive a first response signal from the first capacitive sensor in response to the first excitation signal and receive a second response signal from the second capacitive sensor in response to the second excitation signal; and
wherein the processor circuit is configured to provide the foot presence indication based on a difference between the first and second response signals.

13. The footwear sensor system of claim 12,
wherein the signal generator is configured to provide the first excitation signal to the ring and planar electrodes during a first excitation interval, and provide the second excitation signal to the ring electrode during a second excitation interval, and wherein the planar electrode is electrically de-coupled from the ring electrode during the second excitation interval.

14. A footwear system comprising:
a first electrode;
a second electrode;
a third electrode;
a signal generator configured to provide excitation signals to respective electrode groups of the first, second, and/or third electrodes at respective different times; and
a processor circuit configured to receive electric field information from the respective electrode groups and, in response, determine whether a foot is present in or absent from a foot-receiving cavity of an article of footwear;
wherein:
a first electrode group includes the first and second electrodes electrically coupled as an anode and the third electrode as a cathode;
a second electrode group includes the first electrode as an anode and the third electrode as a cathode and the second electrode is electrically isolated from the first and third electrodes; and
the signal generator is configured to provide a first AC excitation signal to the first electrode group at a first time and provide a second AC excitation signal to the second electrode group at a different second time.

15. The footwear system of claim 14, wherein the processor circuit is configured to receive a first response signal from the first electrode group at the first time and receive a second response signal from the second electrode group at the second time, and
wherein the processor circuit is configured to use information about a difference between the first and second response signals to determine a liquid saturation of a portion of the article of footwear; and
wherein the processor circuit is configured to determine whether the foot is present in or absent from the foot-receiving cavity of the article of footwear using the liquid saturation as-determined.

16. A method comprising:
providing time-multiplexed first and second excitation signals from a signal generator circuit to respective first and second electrode pairs in an article of footwear to thereby generate respective first and second electric fields in the article of footwear;

receiving, at a processor circuit, respective first and second response signals from the first and second electrode pairs; and determining a foot proximity indication for a foot inside the article of footwear using the received first and second response signals;

wherein providing the first excitation signal includes electrically coupling first and second conductor portions of a composite electrode, and wherein providing the second excitation signal includes electrically isolating the first and second conductor portions of the composite electrode, and wherein providing the second excitation signal includes electrically coupling the second conductor portion to a reference electrode.

17. The method of claim 16, wherein providing the first excitation signal to the first electrode pair comprises providing a first AC signal between a reference electrode and electrically-coupled ring and main electrodes;

wherein providing the second excitation signal to the second electrode pair comprises providing a second AC signal between the reference electrode and the ring electrode; and wherein determining the foot proximity indication includes using information about a difference between the first and second response signals.

18. The method of claim 16, further comprising determining a liquid saturation level of a portion of the article of footwear using the first and second response signals, and wherein determining the foot proximity indication includes using the liquid saturation level as-determined.

* * * * *